United States Patent
Watarai et al.

(10) Patent No.: US 10,483,207 B2
(45) Date of Patent: Nov. 19, 2019

(54) SEMICONDUCTOR DEVICE

(71) Applicant: Toshiba Memory Corporation, Minato-ku (JP)

(72) Inventors: Masatoshi Watarai, Fujisawa (JP); Masanori Hatakeyama, Kawasaki (JP); Takuya Kusaka, Kawasaki (JP); Kazunori Masuda, Yokohama (JP); Masato Endo, Yokohama (JP); Koichi Fukuda, Fujisawa (JP); Masato Sugawara, Kawasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/667,977

(22) Filed: Aug. 3, 2017

(65) Prior Publication Data

US 2018/0040565 A1    Feb. 8, 2018

Related U.S. Application Data

(60) Provisional application No. 62/370,547, filed on Aug. 3, 2016.

(51) Int. Cl.
| | |
|---|---|
| *H01L 21/768* | (2006.01) |
| *H01L 23/532* | (2006.01) |
| *H01L 23/535* | (2006.01) |
| *H01L 27/11556* | (2017.01) |
| *H01L 27/11582* | (2017.01) |
| *H01L 27/11565* | (2017.01) |
| *H01L 27/11575* | (2017.01) |

(52) U.S. Cl.
CPC ...... *H01L 23/53295* (2013.01); *H01L 23/535* (2013.01); *H01L 27/11556* (2013.01); *H01L 27/11565* (2013.01); *H01L 27/11575* (2013.01); *H01L 27/11582* (2013.01)

(58) Field of Classification Search
CPC ............ H01L 23/53295; H01L 23/535; H01L 27/11556; H01L 27/11565; H01L 27/11575; H01L 27/11582
See application file for complete search history.

(56) References Cited

U.S. PATENT DOCUMENTS

| | | | |
|---|---|---|---|
| 9,105,335 B2 | 8/2015 | Maejima et al. | |
| 9,362,306 B2 | 6/2016 | Park et al. | |
| 2016/0049423 A1 | 2/2016 | Yoo et al. | |
| 2017/0236834 A1* | 8/2017 | Fukumura | H01L 27/11582 257/314 |
| 2018/0076085 A1* | 3/2018 | Hazue | H01L 21/76816 |
| 2018/0366482 A1* | 12/2018 | Zhou | H01L 27/11556 |
| 2019/0006381 A1* | 1/2019 | Nakatsuji | H01L 27/11556 |

* cited by examiner

*Primary Examiner* — Meiya Li
(74) *Attorney, Agent, or Firm* — Oblon, McClelland, Maier & Neustadt, L.L.P.

(57) ABSTRACT

According to one embodiment, the insulating layer is provided on the terrace portions. The plurality of contact portions extend through the insulating layer in the stacking direction and contact the terrace portions. The second columnar portion extends through the insulating layer and through the second stacked portion in the stacking direction, and includes a second semiconductor body contacting the first semiconductor region. The first insulating portion divides the first semiconductor region in the first direction. The first insulating portion is provided under a boundary portion between the first stacked portion and the second stacked portion.

15 Claims, 38 Drawing Sheets

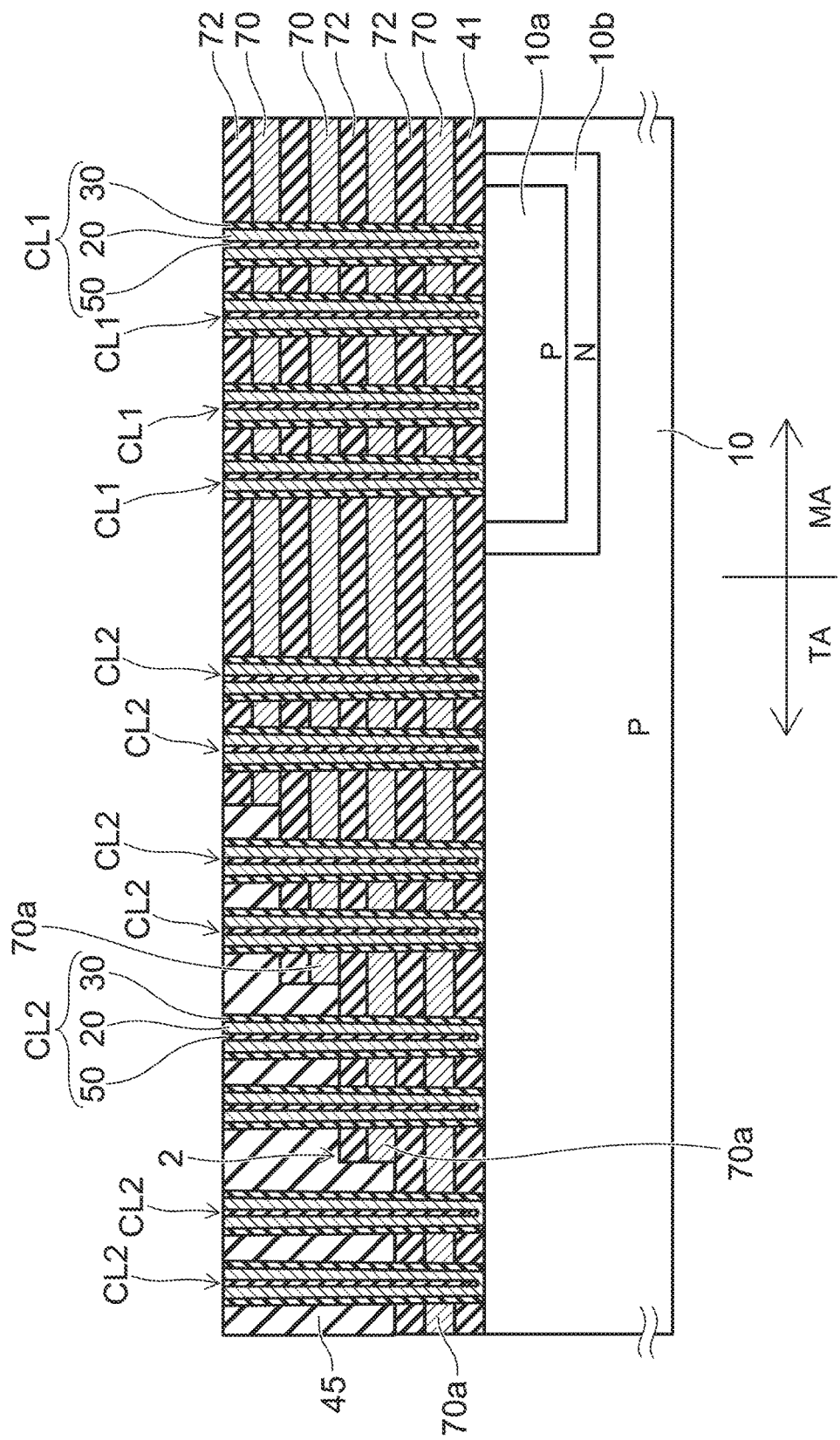

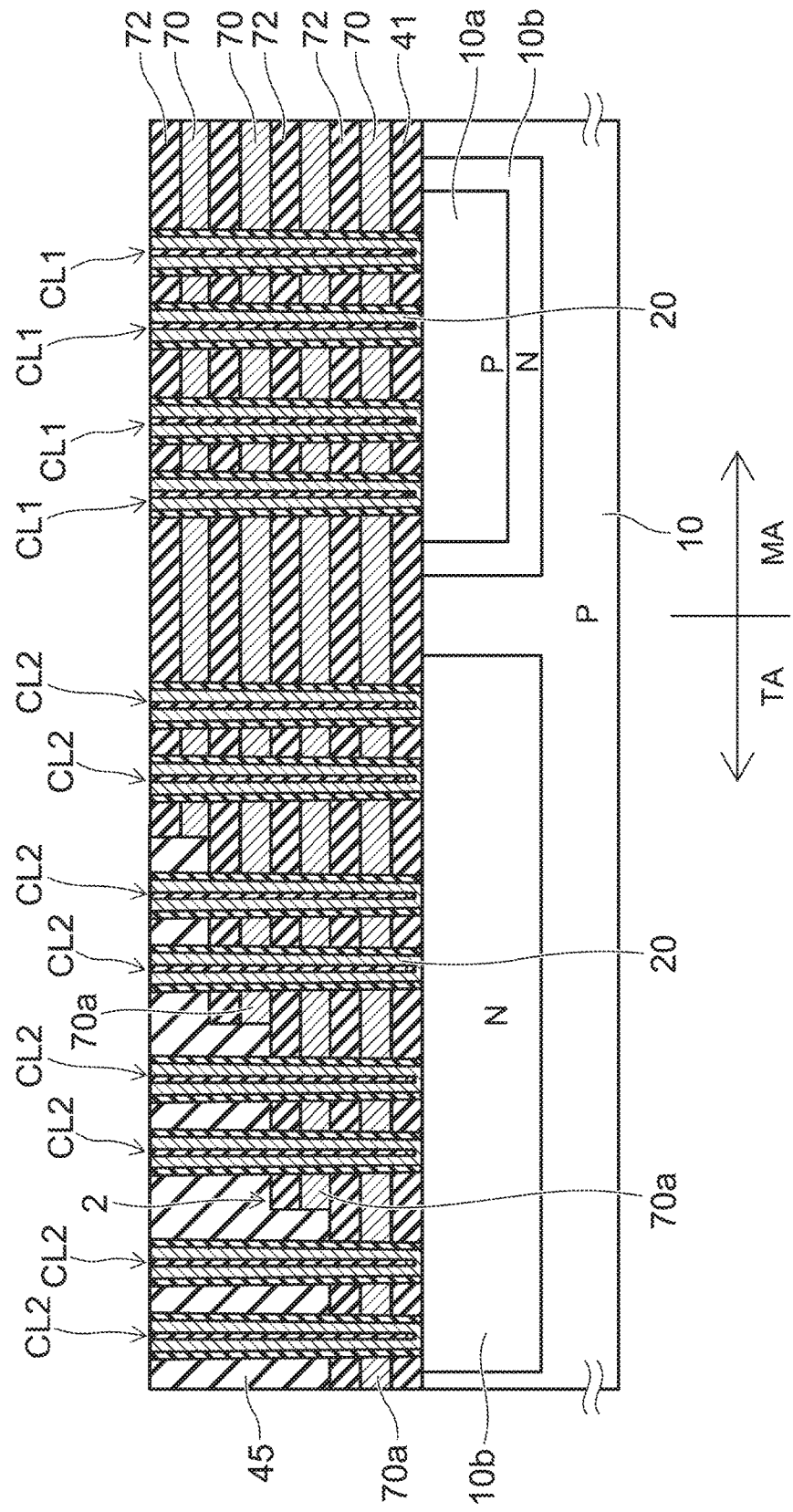

US 10,483,207 B2

SEMICONDUCTOR DEVICE

CROSS-REFERENCE TO RELATED APPLICATION

This application is based upon and claims the benefit of priority from U.S. Provisional Patent Application 62/370,547, filed on Aug. 3, 2016; the entire contents of which are incorporated herein by reference.

FIELD

Embodiments described herein relate generally to a semiconductor device.

BACKGROUND

To connect multiple electrode layers of a three-dimensional memory device to a control circuit, a staircase-shaped contact structure of the multiple electrode layers has been proposed. Further, for the three-dimensional memory device, a method also has been proposed in which a stacked body including multiple sacrificial layers is formed, and an air gap is formed subsequently by removing the sacrificial layers. The stacked body that includes the air gap is supported by a columnar portion that is formed in the stacked body prior to removing the sacrificial layers.

BRIEF DESCRIPTION OF THE DRAWINGS

FIG. 29 to FIG. 32 are schematic cross-sectional views of the memory region and the terrace region of the semiconductor device of the embodiment.

DETAILED DESCRIPTION

According to one embodiment, a semiconductor device includes a first semiconductor region of a first conductivity type, a stacked body provided on the first semiconductor region, a first columnar portion, an insulating layer, a plurality of contact portions, a second columnar portion, and a first insulating portion. The stacked body includes a plurality of electrode layers stacked with an insulating body interposed. The stacked body includes a first stacked portion and a second stacked portion. The electrode layers of the second stacked portion include a plurality of terrace portions arranged in a staircase configuration with a level difference in a first direction. The first columnar portion extends through the first stacked portion in a stacking direction of the stacked body and includes a first semiconductor body contacting the first semiconductor region. The insulating layer is provided on the terrace portions. The plurality of contact portions extend through the insulating layer in the stacking direction and contact the terrace portions. The second columnar portion extends through the insulating layer and through the second stacked portion in the stacking direction, and includes a second semiconductor body contacting the first semiconductor region. The first insulating portion divides the first semiconductor region in the first direction. The first insulating portion is provided under a boundary portion between the first stacked portion and the second stacked portion.

In an embodiment, for example, a semiconductor memory device that includes a memory cell array having a three-dimensional structure is described as a semiconductor device.

Figure 1:
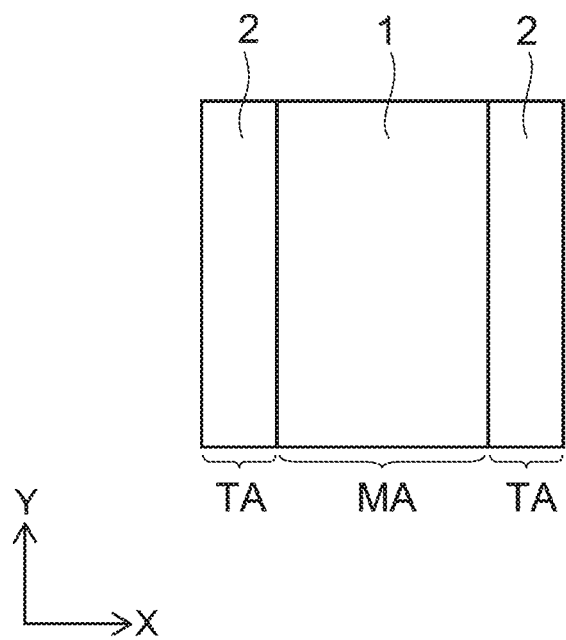
FIG. 1 is a schematic block plan view of a semiconductor device of an embodiment.

FIG. 1 is a schematic block plan view of the semiconductor device of the embodiment.

Figure 2:
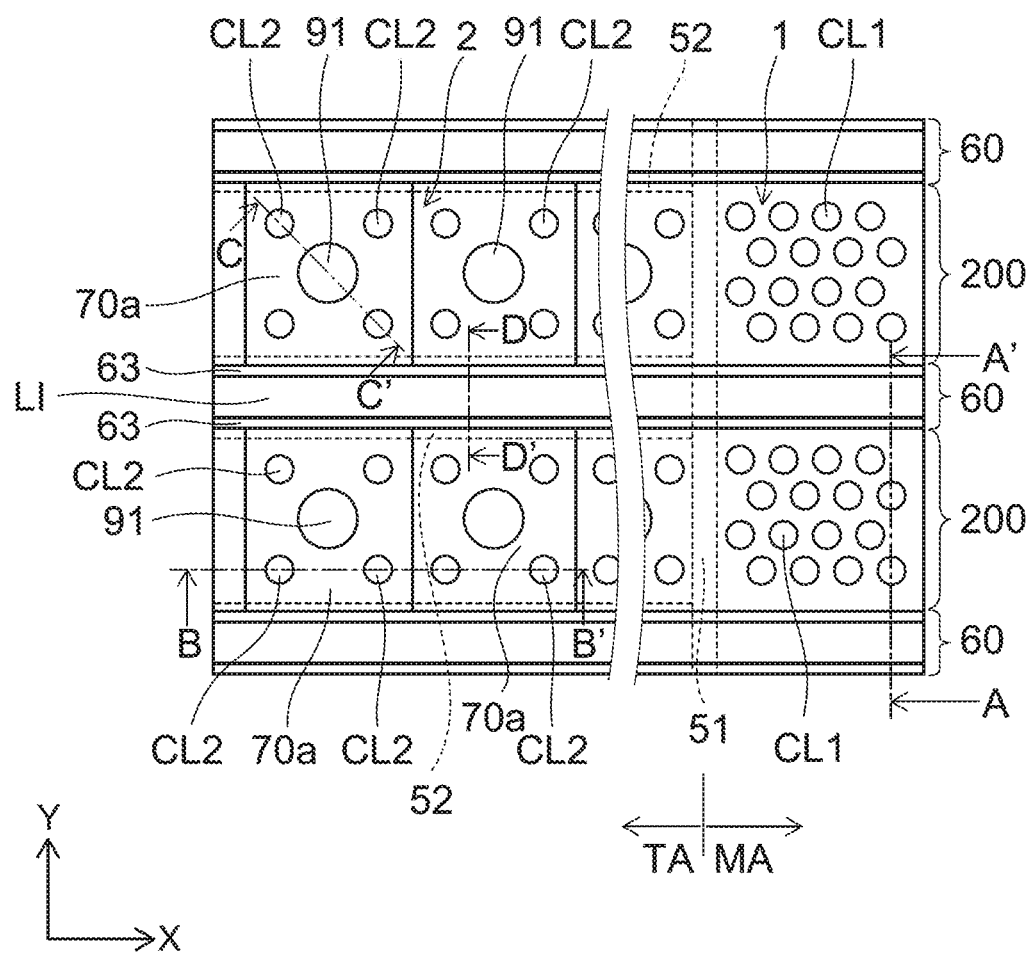
FIG. 2 is a schematic plan view of the semiconductor device of the embodiment.

FIG. 2 is a schematic plan view of the semiconductor device of the embodiment.

The semiconductor device of the embodiment includes a memory region MA and a terrace region TA. A memory cell array 1 is provided in the memory region MA. A staircase portion 2 is provided in the terrace region TA. The memory cell array 1 and the staircase portion 2 are provided on the same substrate.

Figure 3:
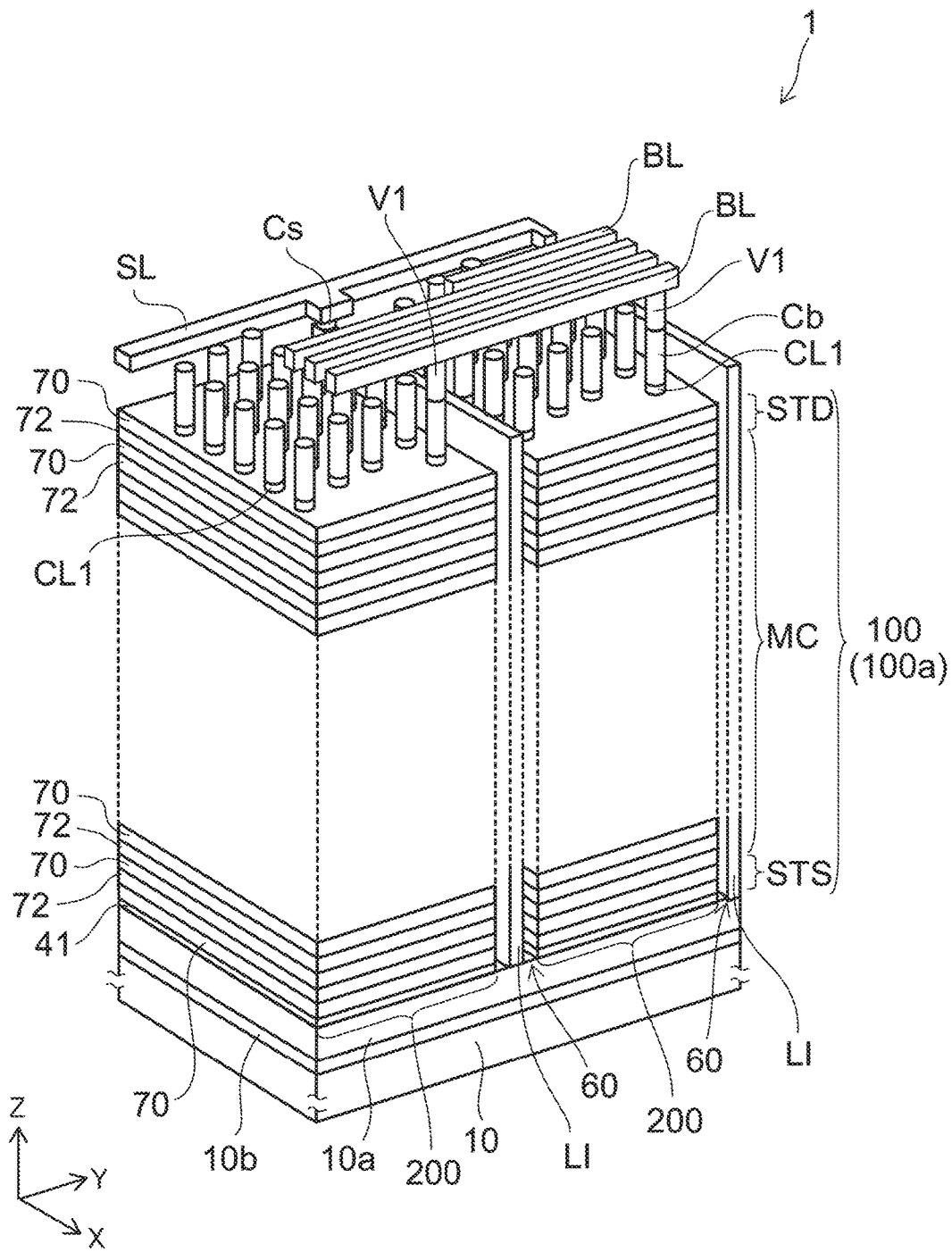
FIG. 3 is a schematic perspective view of a memory cell array of the semiconductor device of the embodiment.

FIG. 3 is a schematic perspective view of the memory cell array 1 of the embodiment.

Figure 4:
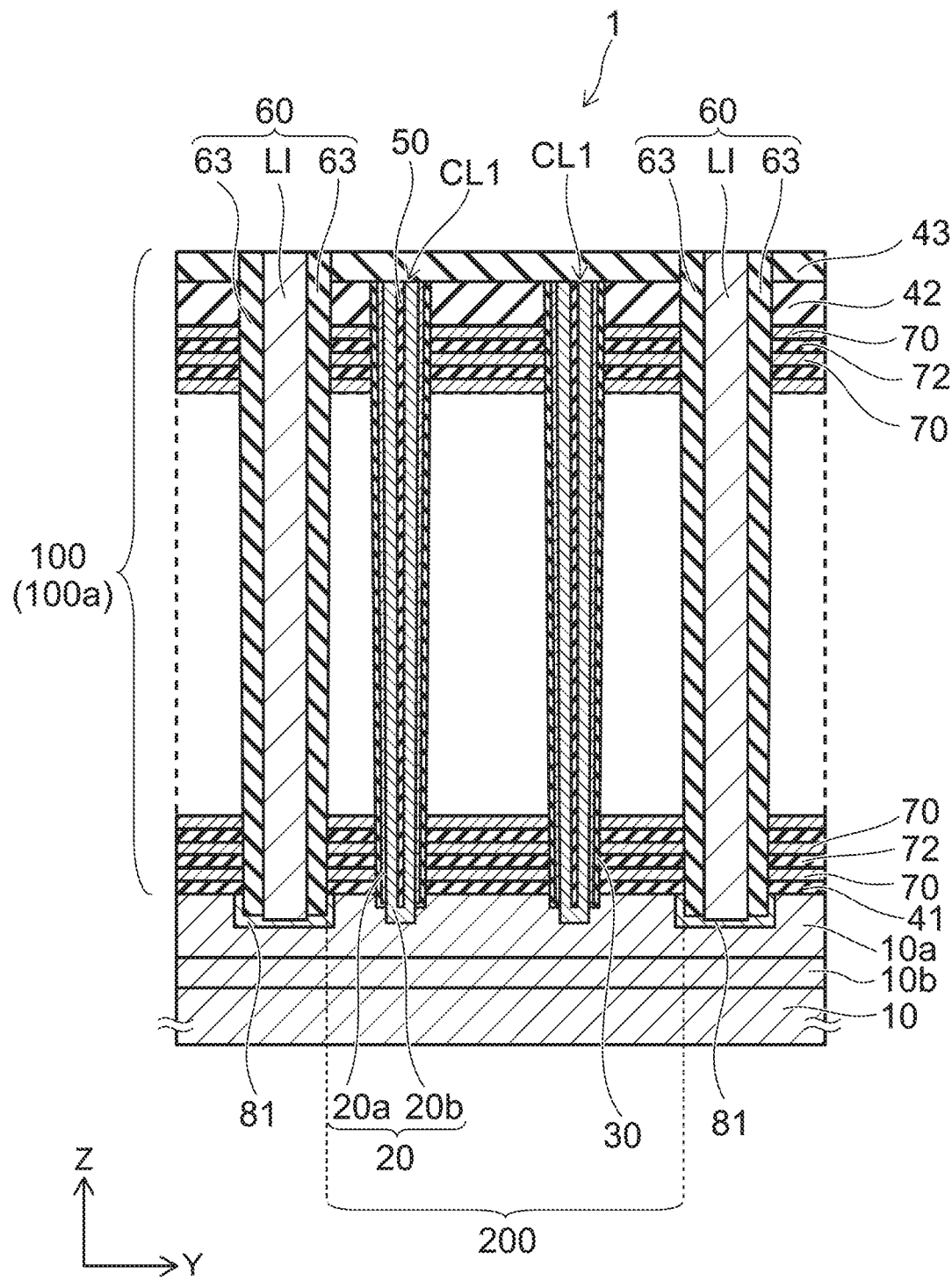
FIG. 4 is an A-A' cross-sectional view of FIG. 2.

FIG. 4 is an A-A' cross-sectional view of FIG. 2.

In FIG. 3, two mutually-orthogonal directions parallel to a major surface of a substrate 10 are taken as an X-direction and a Y-direction; and a direction orthogonal to both the X-direction and the Y-direction is taken as a Z-direction (a stacking direction). The X-direction, the Y-direction, and the Z-direction shown in the other drawings correspond respectively to the X-direction, the Y-direction, and the Z-direction of FIG. 3.

The memory cell array 1 includes the substrate 10, a stacked body 100 provided on the substrate 10, multiple first columnar portions CL1, multiple separation portions 60, and upper layer interconnects provided above the stacked body 100. For example, bit lines BL and a source line SL are shown as the upper layer interconnects in FIG. 3.

The substrate 10 is provided in the memory region MA and the terrace region TA; and the stacked body 100 also is provided in the memory region MA and the terrace region TA. The portion of the stacked body 100 provided in the memory region MA is taken as a first stacked portion 100*a*; and the portion of the stacked body 100 provided in the terrace region TA is taken as a second stacked portion 100*b*.

The multiple first columnar portions CL1 are disposed in the memory region MA. The first columnar portions CL1 are formed in substantially circular columnar configurations extending through the first stacked portion 100*a* in the stacking direction of the first stacked portion 100*a* (the Z-direction).

As shown in FIG. 2, for example, the multiple first columnar portions CL1 have a staggered arrangement. Or, the multiple first columnar portions CL1 may have a square lattice arrangement along the X-direction and the Y-direction.

As shown in FIG. 2, the separation portions 60 extend through the memory region MA and the terrace region TA in the X-direction and divide the stacked body 100 into multiple blocks (or finger portions) 200 in the Y-direction.

As shown in FIG. 3, the multiple bit lines BL are provided above the first stacked portion 100a. The multiple bit lines BL are, for example, metal films extending in the Y-direction. The multiple bit lines BL are separated from each other in the X-direction.

The upper end portions of semiconductor bodies 20 of the first columnar portions CL1 described below are connected to the bit lines BL via contacts Cb and contacts V1 shown in FIG. 3.

The multiple first columnar portions CL1 are connected to one common bit line BL. The multiple first columnar portions CL1 that are connected to the common bit line BL include one first columnar portion CL1 selected from each block 200 separated in the Y-direction by the separation portions 60.

As shown in FIG. 4, the first stacked portion 100a includes multiple electrode layers 70 stacked on the substrate 10. The multiple electrode layers 70 are stacked, with insulating layers 72 interposed, in a direction (the Z-direction) perpendicular to a major surface of the substrate 10. The electrode layer 70 is a metal layer. The electrode layer 70 is, for example, a tungsten layer including tungsten as a major component or a molybdenum layer including molybdenum as a major component. The insulating layer 72 is a silicon oxide layer including silicon oxide as a major component.

The substrate 10 is, for example, a P-type silicon substrate; and a first semiconductor region 10a is provided on the front surface side of the substrate 10. A second semiconductor region 10b is provided at a position of the substrate 10 that is deeper than the first semiconductor region 10a. The second semiconductor region 10b is provided under the first semiconductor region 10a and contacts the bottom of the first semiconductor region 10a. The first semiconductor region 10a is a P-type silicon region (a P-type well); and the second semiconductor region 10b is an N-type silicon region (an N-type well).

An insulating layer 41 is provided on the front surface of the first semiconductor region 10a. The electrode layer 70 of the lowermost layer is provided on the insulating layer 41. An insulating layer 42 is provided on the electrode layer 70 of the uppermost layer; and an insulating layer 43 is provided on the insulating layer 42. The insulating layer 43 covers the upper ends of the first columnar portions CL1.

Figure 5A:
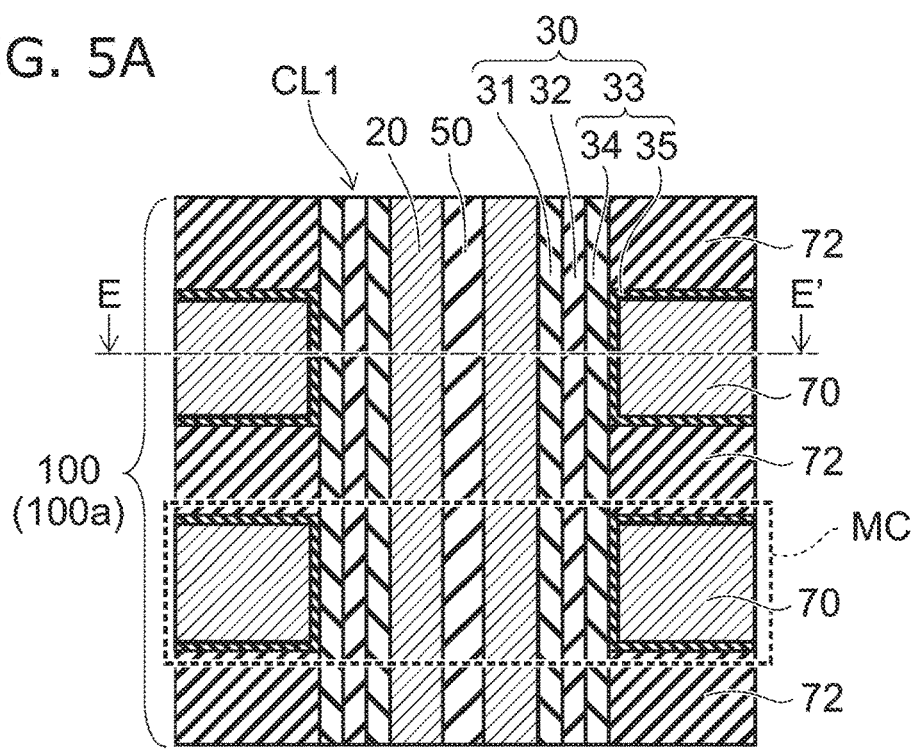
FIG. 5A is an enlarged cross-sectional view of one portion of FIG. 4.

FIG. 5A is an enlarged cross-sectional view of one portion of FIG. 4.

Figure 5B:
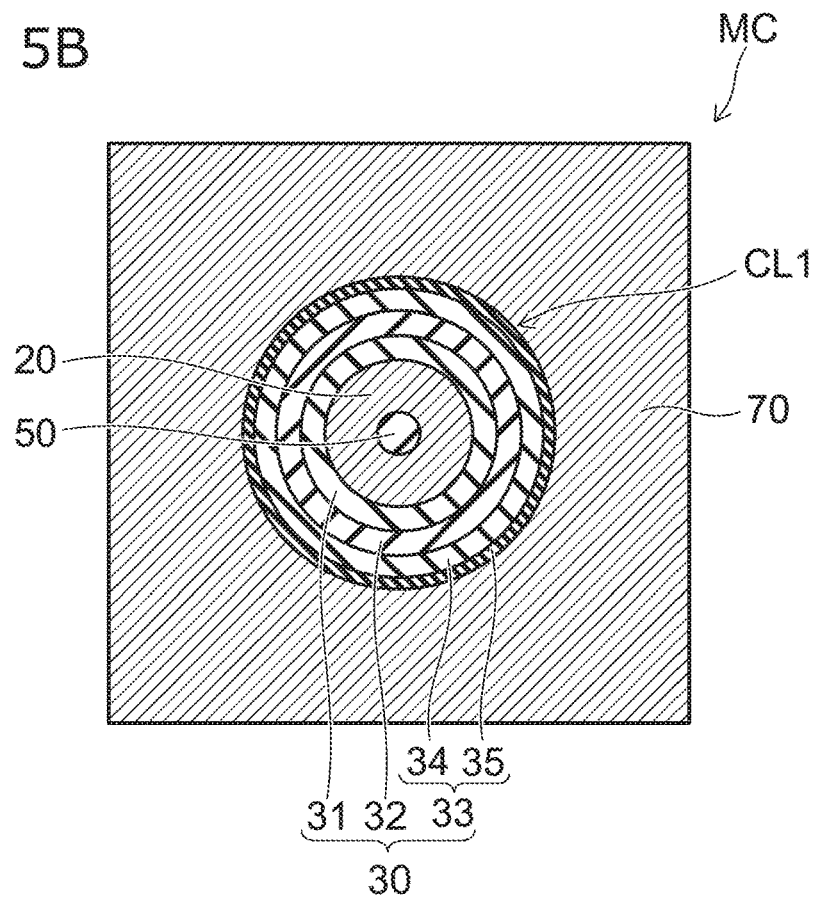
FIG. 5B is an E-E' cross-sectional view of FIG. 5A.

FIG. 5B is an E-E' cross-sectional view of FIG. 5A.

The first columnar portion CL1 includes a stacked film (a memory film) 30, the semiconductor body 20, and a core film 50 that is insulative.

The semiconductor body 20 extends to be continuous in a pipe-like configuration through the first stacked portion 100a in the stacking direction (the Z-direction). The stacked film 30 is provided between the semiconductor body 20 and the electrode layers 70 and surrounds the semiconductor body 20 from the outer perimeter side. The core film 50 is provided on the inner side of the semiconductor body 20 having the pipe-like configuration. The upper end portion of the semiconductor body 20 is connected to the bit line BL via the contact Cb and the contact V1 shown in FIG. 3.

As shown in FIG. 4, the lower end portion of the semiconductor body 20 contacts the first semiconductor region 10a. The lower end portion of the semiconductor body 20 is positioned higher than the P-N junction portion between the first semiconductor region 10a and the second semiconductor region 10b.

The stacked film 30 includes a tunneling insulating film 31, a charge storage film (a charge storage portion) 32, and a blocking insulating film 33.

The tunneling insulating film 31 is provided between the semiconductor body 20 and the charge storage film 32. The charge storage film 32 is provided between the tunneling insulating film 31 and the blocking insulating film 33. The blocking insulating film 33 is provided between the charge storage film 32 and the electrode layer 70.

The semiconductor body 20, the stacked film 30, and the electrode layer 70 are included in a memory cell MC. The memory cell MC has a vertical transistor structure in which the electrode layer 70 surrounds, with the stacked film 30 interposed, the periphery of the semiconductor body 20.

In the memory cell MC having the vertical transistor structure, the semiconductor body 20 is, for example, a channel body of silicon; and the electrode layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film and includes, for example, a silicon nitride film.

The tunneling insulating film 31 is used as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of the charge from the electrode layer 70 into the first columnar portion CL1.

The blocking insulating film 33 includes a first blocking film 34 and a second blocking film 35. The first blocking film 34 is, for example, a silicon oxide film. The second blocking film 35 is a metal oxide film having a higher dielectric constant than that of the silicon oxide film. For example, an aluminum oxide film, a zirconium oxide film, and a hafnium oxide film can be used as the metal oxide film.

The first blocking film 34 is provided between the charge storage film 32 and the second blocking film 35. The second blocking film 35 is provided between the first blocking film 34 and the electrode layer 70.

The tunneling insulating film 31, the charge storage film 32, and the first blocking film 34 extend to be continuous in the stacking direction of the stacked body 100 (the Z-direction).

The second blocking film 35 is provided also between the electrode layer 70 and the insulating layer 72. The second blocking film 35 is formed to be continuous along the upper surface of the electrode layer 70, the lower surface of the electrode layer 70, and the side surface of the electrode layer 70 on the stacked film 30 side. The second blocking film 35 is discontinuous in the stacking direction of the stacked body 100 and is divided.

Or, the second blocking film 35 may be formed to be continuous along the stacking direction without forming the second blocking film 35 between the electrode layer 70 and the insulating layer 72. Or, the blocking insulating film 33 may be a single-layer film continuous along the stacking direction.

A metal nitride film may be formed between the second blocking film 35 and the electrode layer 70 or between the insulating layer 72 and the electrode layer 70. The metal nitride film is, for example, a titanium nitride film and can function as a barrier metal, an adhesion layer, or a seed metal of the electrode layer 70.

As shown in FIG. 3, a drain-side selection transistor STD is provided at the upper layer portion of the first stacked portion 100a (the upper end portion of the first columnar portion CL1). A source-side selection transistor STS is provided at the lower layer portion of the first stacked portion 100a (the lower end portion of the first columnar portion CL1).

The electrode layer 70 of at least the uppermost layer functions as a control gate of the drain-side selection transistor STD. The electrode layer 70 of at least the lowermost layer functions as a control gate of the source-side selection transistor STS.

The multiple memory cells MC are provided between the drain-side selection transistor STD and the source-side selection transistor STS. The multiple memory cells MC, the drain-side selection transistor STD, and the source-side selection transistor STS are connected in series via the semiconductor body 20 of the first columnar portion CL1 and are included in one memory string. For example, the memory strings have a staggered arrangement in a planar direction parallel to the XY plane; and the multiple memory cells MC are provided three-dimensionally in the X-direction, the Y-direction, and the Z-direction.

The separation portion 60 will now be described.

As shown in FIG. 2 and FIG. 4, the separation portion 60 includes an interconnect portion LI and an insulating film 63. The insulating film 63 is not illustrated in FIG. 3.

The interconnect portion LI spreads in the X-direction and the Z-direction and is, for example, a film including a metal. The insulating film 63 is provided on the side surface of the interconnect portion LI. As shown in FIG. 4, the insulating film 63 is provided between the first stacked portion 100a and the interconnect portion LI.

As shown in FIG. 4, multiple semiconductor regions 81 are formed in the front surface of the first semiconductor region 10a. The semiconductor regions 81 are positioned higher than the P-N junction portion between the first semiconductor region 10a and the second semiconductor region 10b.

The lower end portions of the interconnect portions LI contact the semiconductor regions 81. The multiple semiconductor regions 81 are provided to correspond to the multiple interconnect portions LI. The multiple semiconductor regions 81 include an N-type semiconductor region 81 and a P-type semiconductor region 81.

The multiple interconnect portions LI include the interconnect portion LI connected to the N-type semiconductor region 81 and the interconnect portion LI connected to the P-type semiconductor region 81.

The upper end of the interconnect portion LI connected to the N-type semiconductor region 81 is connected to the source line SL via a contact Cs shown in FIG. 3.

By controlling the potential applied to the electrode layer 70 of the lowermost layer, an N-channel (an inversion layer) can be induced in the front surface of the P-type first semiconductor region 10a between the N-type semiconductor region 81 and the lower end portion of the semiconductor body 20; and a current can be caused to flow between the N-type semiconductor region 81 and the lower end portion of the semiconductor body 20. The electrode layer 70 of the lowermost layer functions as a control gate for inducing the channel in the front surface of the first semiconductor region 10a; and the insulating layer 41 functions as a gate insulating film.

In a read operation, electrons are supplied from the interconnect portion LI to the semiconductor body 20 via the N-type semiconductor region 81 and the N-channel.

The upper end portion of the interconnect portion LI connected to the P-type semiconductor region 81 is connected to a not-illustrated upper layer interconnect. In an erase operation, the P-type semiconductor region 81 supplies holes to the semiconductor body 20 via the first semiconductor region 10a.

The terrace region TA will now be described.

Figure 6:
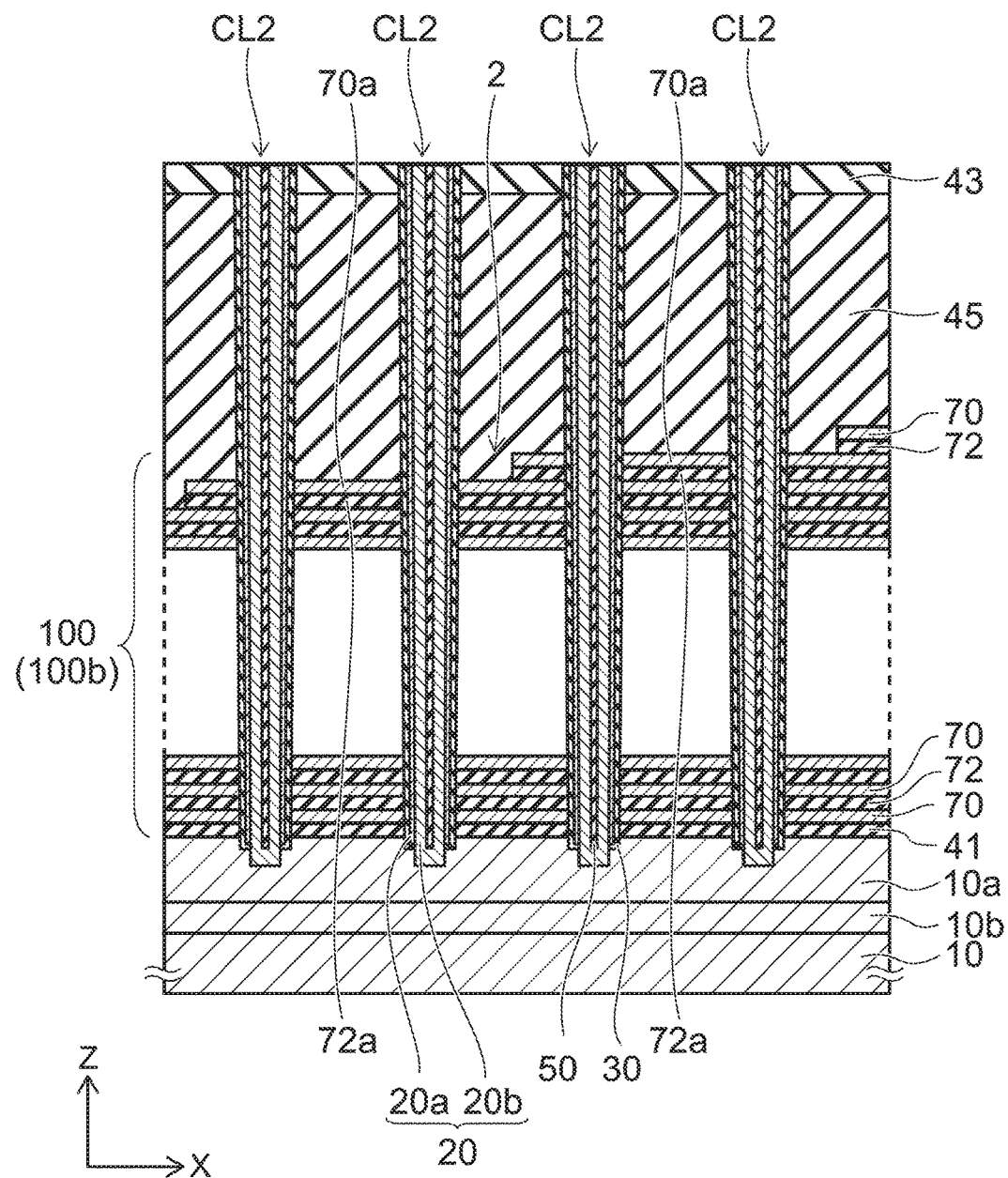
FIG. 6 is a B-B' cross-sectional view of FIG. 2.

FIG. 6 is a B-B' cross-sectional view of FIG. 2.

Figure 7:
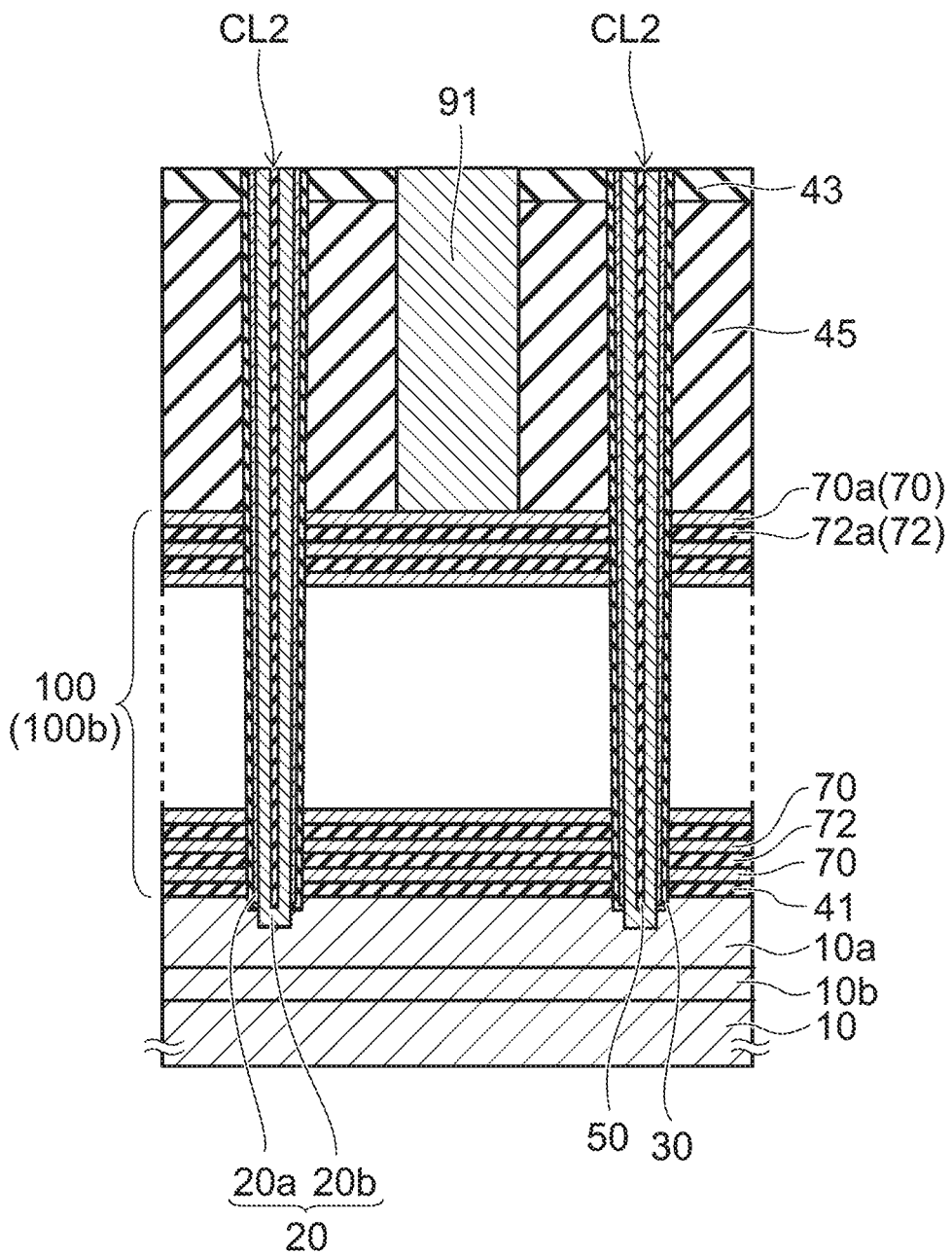
FIG. 7 is a C-C' cross-sectional view of FIG. 2.

FIG. 7 is a C-C' cross-sectional view of FIG. 2.

The stacked body 100 and the separation portions 60 extend in the X-direction from the memory region MA to the terrace region TA. The substrate 10, the first semiconductor region 10a, and the second semiconductor region 10b also are provided in the terrace region TA.

The separation portions 60 separate the second stacked portion 100b of the terrace region TA into the multiple blocks (or finger portions) 200 in the Y-direction.

As shown in FIG. 6, the multiple electrode layers 70 of the second stacked portion 100b have multiple terrace portions 70a arranged in a staircase configuration by forming a level difference along the X-direction. The staircase portion 2 is formed of the multiple terrace portions 70a.

All of the electrode layers 70 and insulating layers 72 above the terrace portions 70a are removed and do not remain. The electrode layers 70 of the other layers do not overlap above each of the terrace portions 70a.

The multiple insulating layers 72 of the second stacked portion 100b also are patterned into a staircase configuration; and the multiple insulating layers 72 have multiple terrace portions 72a arranged in a staircase configuration by forming a level difference along the X-direction. The terrace portions 70a of the electrode layers 70 are stacked on the terrace portions 72a of the insulating layers 72.

An insulating layer 45 is provided on the staircase portion 2. The insulating layer 45 fills the level differences of the staircase portion 2 and eliminates or relaxes the level difference between the second stacked portion 100b and the first stacked portion 100a. The insulating layer 43 is provided on the insulating layer 45.

Multiple second columnar portions CL2 are disposed in the terrace region TA. The second columnar portions CL2 are formed in substantially circular columnar configurations extending in the stacking direction (the Z-direction) through the insulating layer 45 and through the second stacked portion 100b under the insulating layer 45.

As shown in FIG. 6, the second columnar portions CL2 pierce the insulating layer 43, the insulating layer 45, and the second stacked portion 100b and reach the first semiconductor region 10a. The second columnar portions CL2 pierce the terrace portions 70a.

At least one second columnar portion CL2 is disposed at one terrace portion 70a. In the example shown in FIG. 2, four second columnar portions CL2 are disposed at one terrace portion 70a.

As shown in FIG. 2, the multiple first columnar portions CL1 of the memory region MA are arranged more densely than the multiple second columnar portions CL2 of the terrace region TA.

The second columnar portions CL2 are formed simultaneously when forming the first columnar portions CL1 and include the stacked film (the insulating film) 30, the semiconductor body 20, and the core film 50 similarly to the first columnar portions CL1 as shown in FIG. 6.

The stacked film 30 of the second columnar portion CL2 has the same stacked structure of films of the same materials as the stacked film 30 of the first columnar portion CL1. The semiconductor body 20 of the second columnar portion CL2 is a film of the same material as the semiconductor body 20 of the first columnar portion CL1. The core film 50 of the second columnar portion CL2 is a film of the same material as the core film 50 of the first columnar portion CL1.

The lower end portions of the semiconductor bodies 20 of the second columnar portions CL2 contact the first semiconductor region 10a. The lower end portions of the semiconductor bodies 20 of the second columnar portions CL2 are positioned higher than the P-N junction portion between the first semiconductor region 10a and the second semiconductor region 10b.

The upper end portions of the semiconductor bodies 20 of the second columnar portions CL2 are not connected to the upper layer interconnects and are not connected electrically to anything. The second columnar portions CL2 do not function as components of the memory cells or the selection transistors, and function as single pillars supporting the multiple electrode layers 70 when the gaps described below are formed.

As shown in FIG. 2 and FIG. 7, contact portions 91 are provided on the terrace portions 70a. At least one contact portion 91 is disposed at one terrace portion 70a. The multiple contact portions 91 are provided on the staircase portion 2 to correspond to the multiple terrace portions 70a.

The contact portion 91 is a conductive body having a substantially circular columnar configuration. The contact portion 91 is a metal body and includes, for example, tungsten or molybdenum as a major component. The diameter of the contact portion 91 is larger than the diameter of the first columnar portion CL1 and the diameter of the second columnar portions CL2.

The contact portions 91 extend through the insulating layer 45 in the stacking direction of the stacked body 100 and contact the terrace portions 70a. The peripheries of the contact portions 91 are surrounded with the insulating layer 45.

The contact portions 91 are connected to not-illustrated upper layer interconnects. For example, the upper layer interconnects are electrically connected to a control circuit formed in the front surface of the substrate 10. The potentials of the electrode layers 70 of the memory cell array 1 are controlled via the contact portions 91 and the terrace portions 70a.

Figure 8:
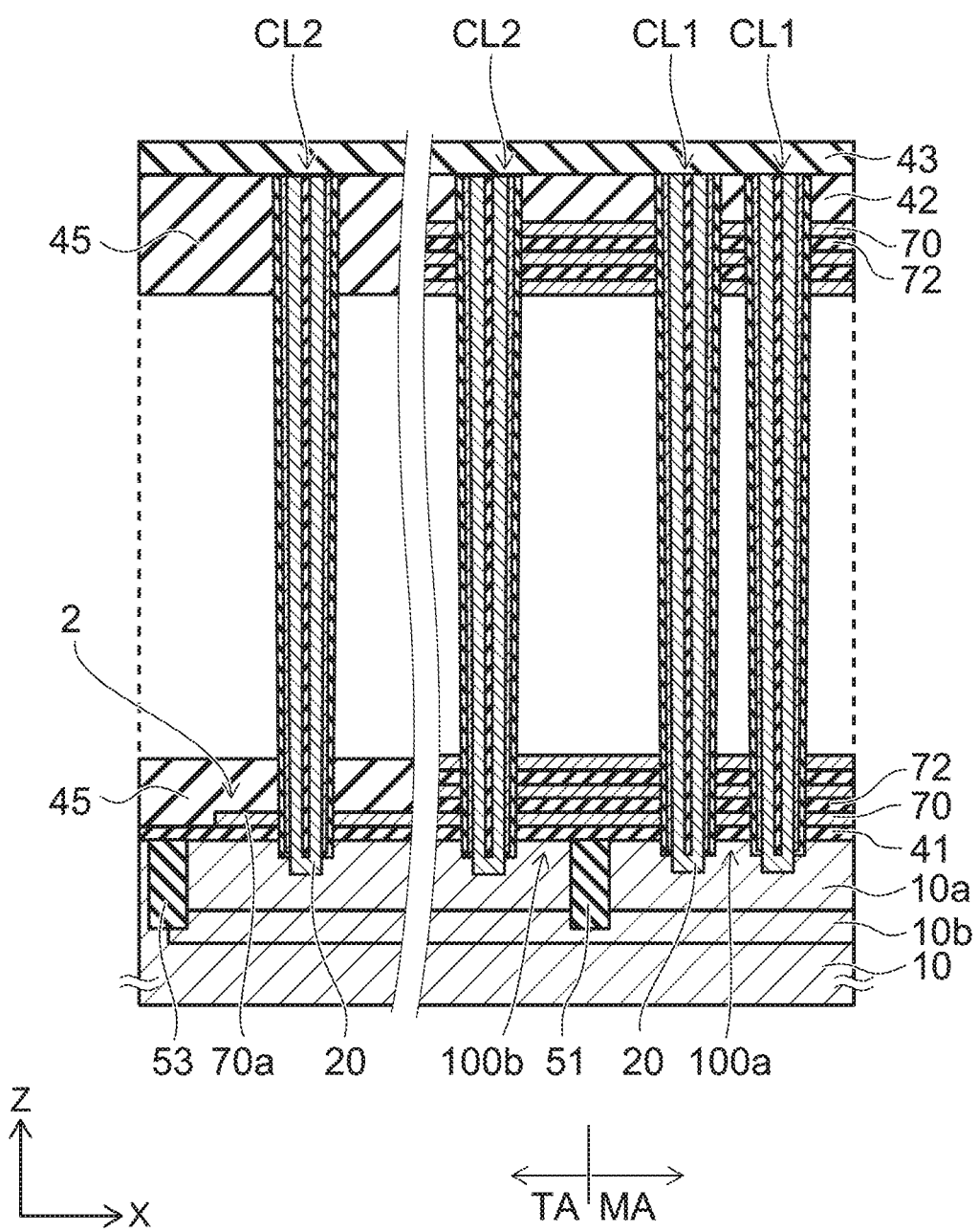
FIG. 8 is a schematic cross-sectional view of a boundary portion between a memory region and a terrace region of the semiconductor device of the embodiment.

FIG. 8 is a schematic cross-sectional view along the X-direction of the boundary portion between the memory region MA and the terrace region TA. The cross section of the end portion vicinity in the X-direction of the staircase portion 2 also is illustrated in FIG. 8.

Figure 9:
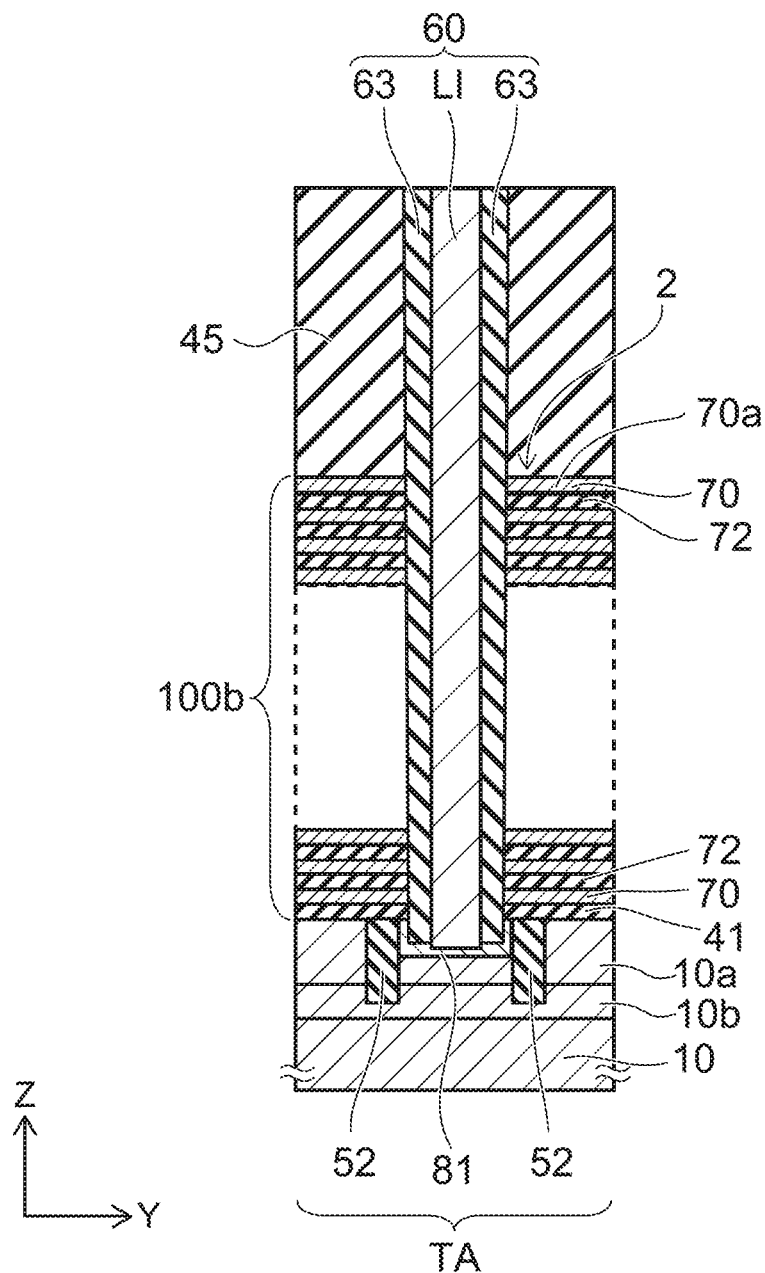
FIG. 9 is a D-D' cross-sectional view of FIG. 2.

FIG. 9 is a D-D' cross-sectional view of FIG. 2.

As shown in FIG. 2, the multiple first columnar portions CL1 are disposed in the memory region MA; but the second columnar portions CL2 are not disposed in the memory region MA. The multiple second columnar portions CL2 are disposed in the terrace region TA; but the first columnar portions CL1 are not disposed in the terrace region TA.

The boundary portion between the memory region MA and the terrace region TA is positioned between the first columnar portion CL1 positioned the furthest on the terrace region TA side and the second columnar portion CL2 positioned the furthest on the memory region MA side. Also, the boundary portion between the memory region MA and the terrace region TA corresponds to the boundary portion between the first stacked portion 100a and the second stacked portion 100b.

As shown in FIG. 8, a first insulating portion 51 is provided in the first semiconductor region 10a under the boundary portion between the memory region MA and the terrace region TA. The first insulating portion 51 has a shallow trench isolation (STI) structure in which an insulating film is filled into a trench formed in the first semiconductor region 10a.

As shown by the broken lines in FIG. 2, the first insulating portion 51 extends in the Y-direction at the boundary portion between the memory region MA and the terrace region TA. As shown in FIG. 8, the first insulating portion 51 pierces the first semiconductor region 10a; and the bottom of the first insulating portion 51 reaches the second semiconductor region 10b. The bottom of the first insulating portion 51 is at a position that is deeper than the P-N junction portion between the first semiconductor region 10a and the second semiconductor region 10b.

The first insulating portion 51 divides the first semiconductor region 10a of the memory region MA and the first semiconductor region 10a of the terrace region TA in the X-direction.

Also, the P-N junction between the first semiconductor region 10a and the second semiconductor region 10b breaks the electrical connection via the region under the first insulating portion 51 between the first semiconductor region 10a of the memory region MA and the first semiconductor region 10a of the terrace region TA.

Such a first insulating portion 51 and such a P-N junction between the first semiconductor region 10a and the second semiconductor region 10b electrically isolate the first semiconductor region 10a in contact with the semiconductor body 20 of the first columnar portion CL1 from the first semiconductor region 10a in contact with the semiconductor body 20 of the second columnar portion CL2.

Also, as shown in FIG. 9, a second insulating portion 52 is provided at the side of the lower end portion of the interconnect portion LI of the terrace region TA. The second insulating portion 52 has a STI structure in which an insulating film is filled into a trench formed in the first semiconductor region 10a.

As shown by the broken lines in FIG. 2, the second insulating portion 52 extends in the X-direction along the interconnect portion LI. As shown in FIG. 9, the second insulating portion 52 pierces the first semiconductor region 10a; and the bottom of the second insulating portion 52 reaches the second semiconductor region 10b. The bottom of the second insulating portion 52 is at a position that is deeper than the P-N junction portion between the first semiconductor region 10a and the second semiconductor region 10b.

The second insulating portion 52 separates the first semiconductor region 10a under the interconnect portion LI from the first semiconductor region 10a under the terrace portion 70a in the Y-direction.

Such a second insulating portion 52 and such a P-N junction between the first semiconductor region 10a and the second semiconductor region 10b electrically isolate the interconnect portion LI from the semiconductor body 20 of the second columnar portion CL2 contacting the first semiconductor region 10a under the terrace portion 70a.

Also, as shown in FIG. 8, a third insulating portion 53 is provided in the first semiconductor region 10a in a region further on the outer side of the end portion in the X-direction of the staircase portion 2. The third insulating portion 53 has a STI structure in which an insulating film is filled into a trench formed in the first semiconductor region 10a.

The third insulating portion 53 extends in the Y-direction. The third insulating portion 53 pierces the first semiconductor region 10a; and the bottom of the third insulating portion 53 reaches the second semiconductor region 10b. The bottom of the third insulating portion 53 is at a position that is deeper than the P-N junction portion between the first semiconductor region 10a and the second semiconductor region 10b.

A control circuit (not illustrated) that controls the memory cell array 1 is provided in the front surface of the substrate 10 in a region on the outer side of the terrace region TA. The third insulating portion 53 electrically isolates the control circuit and the terrace region TA.

The lower end portions of the semiconductor bodies 20 of the first columnar portions CL1 of the memory cell array 1 contact the first semiconductor region 10a, The potentials of the semiconductor bodies 20 of the first columnar portions CL1 can be controlled via the interconnect portion LI and the first semiconductor region 10a.

To reduce the process cost, the first columnar portions CL1 and the second columnar portions CL2 of the terrace region TA are formed simultaneously and have the same structure. The lower end portions of the semiconductor bodies 20 of the second columnar portions CL2 contact the first semiconductor region 10a. Therefore, voltage stress may be applied also to the second columnar portions CL2 via the first semiconductor region 10a. For example, when erasing, a voltage of about 20 V is applied to the first semiconductor region 10a.

Voltage stress may cause dielectric breakdown of the insulating films (the stacked films) 30 of the second columnar portions CL2, The dielectric breakdown may cause operation errors such as the electrode layers 70 of different layers being shorted to each other via the semiconductor bodies 20 of the second columnar portions CL2.

According to the embodiment, the first semiconductor region 10a that is in contact with the semiconductor body 20 of the first columnar portion CL1 and the first semiconductor region 10a that is in contact with the semiconductor body 20 of the second columnar portion CL2 are electrically isolated. Further, the first semiconductor region 10a that is in contact with the semiconductor body 20 of the second columnar portion CL2 is electrically isolated also from the interconnect portion LI.

Therefore, the operating voltage of the memory cell array 1 is not applied to the first semiconductor region 10a in contact with the semiconductor bodies 20 of the second columnar portions CL2; and voltage stress is not applied to the second columnar portions CL2. This suppresses the operation errors due to the dielectric breakdown of the second columnar portions CL2 and increases the reliability of the device.

A method for manufacturing the semiconductor device of the embodiment will now be described.

First, the processes for the first stacked portion 100a of the memory region MA will be described with reference to FIG. 10 to FIG. 20. FIG. 10 to FIG. 20 are cross-sectional views corresponding to the A-A' cross section of FIG. 2.

Figure 10:
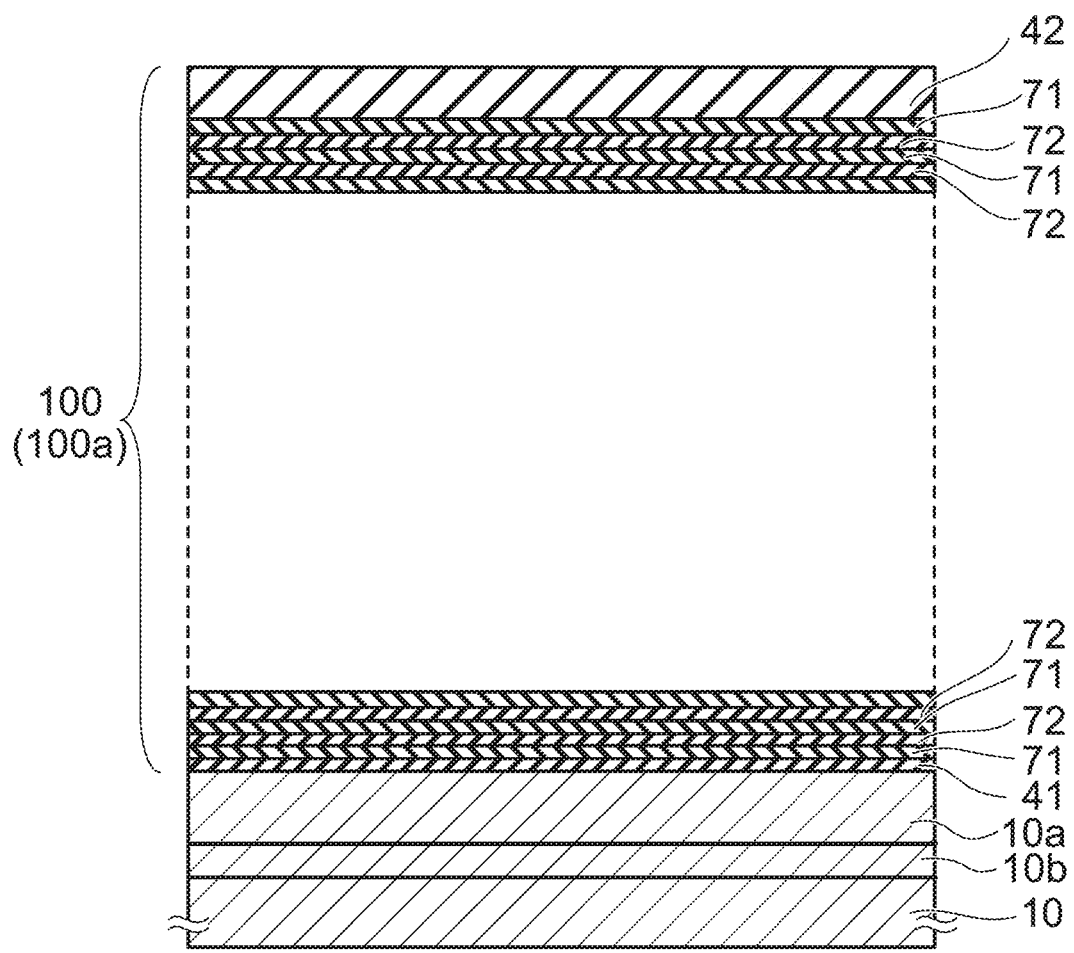
FIG. 10 to FIG. 25 are schematic cross-sectional views showing a method for manufacturing the semiconductor device of the embodiment.

As shown in FIG. 10, the insulating layer 41 is formed on the first semiconductor region 10a of the substrate 10. A sacrificial layer 71 as a first layer and the insulating layer 72 as a second layer are stacked alternately on the insulating layer 41. The process of alternately stacking the sacrificial layer 71 and the insulating layer 72 is repeated; and the multiple sacrificial layers 71 and the multiple insulating layers 72 are formed on the substrate 10. The insulating layer 42 is formed on the sacrificial layer 71 of the uppermost layer. For example, the sacrificial layers 71 are silicon nitride layers; and the insulating layers 72 are silicon oxide layers.

Figure 11:
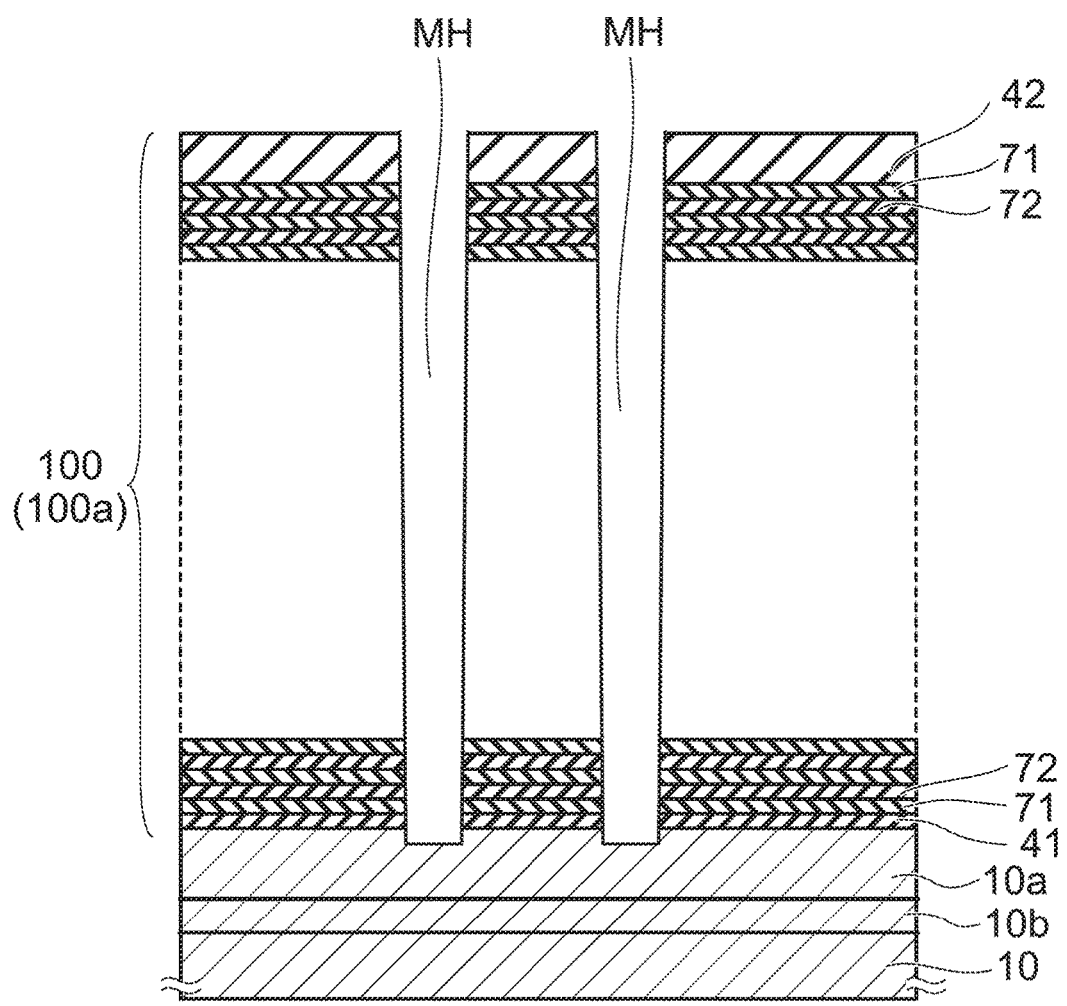

As shown in FIG. 11, multiple memory holes MH are formed in the first stacked portion 100a including the multiple sacrificial layers 71 and the multiple insulating layers 72. The memory holes MH are formed by reactive ion etching (RIE) using a not-illustrated mask layer. The memory holes MH pierce the insulating layer 42, the multiple sacrificial layers 71, the multiple insulating layers 72, and the insulating layer 41 and reach the first semiconductor region 10a.

Figure 12:
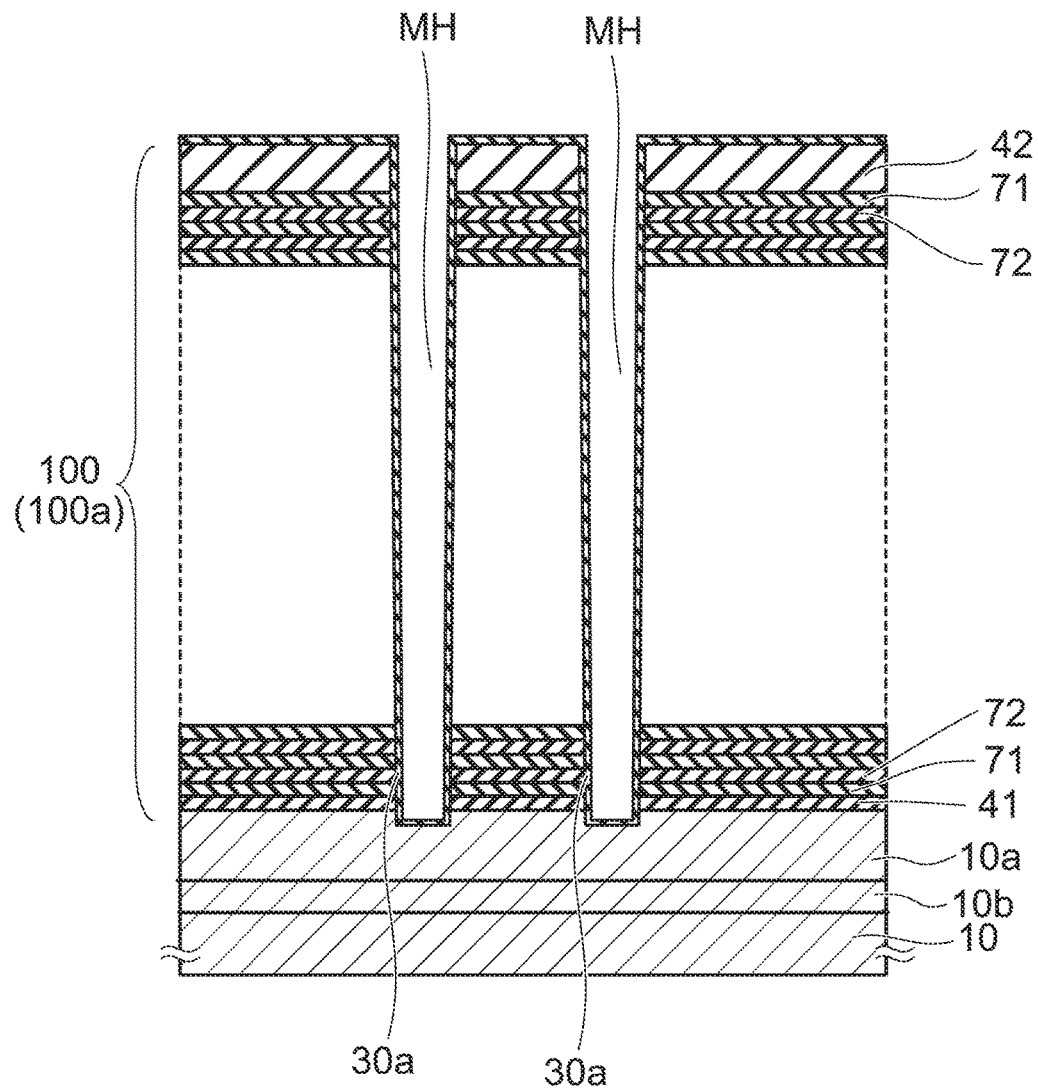

As shown in FIG. 12, a stacked film 30a is formed inside the memory holes MH. The stacked film 30a is formed conformally along the bottoms and side surfaces of the memory holes MH. The stacked film 30a includes, for example, the tunneling insulating film 31, the charge storage film 32, and the first blocking film 34 of the stacked film 30 shown in FIG. 5A and FIG. 5B. The first blocking film 34, the charge storage film 32, and the tunneling insulating film 31 are formed in order inside the memory holes MH.

Figure 13:
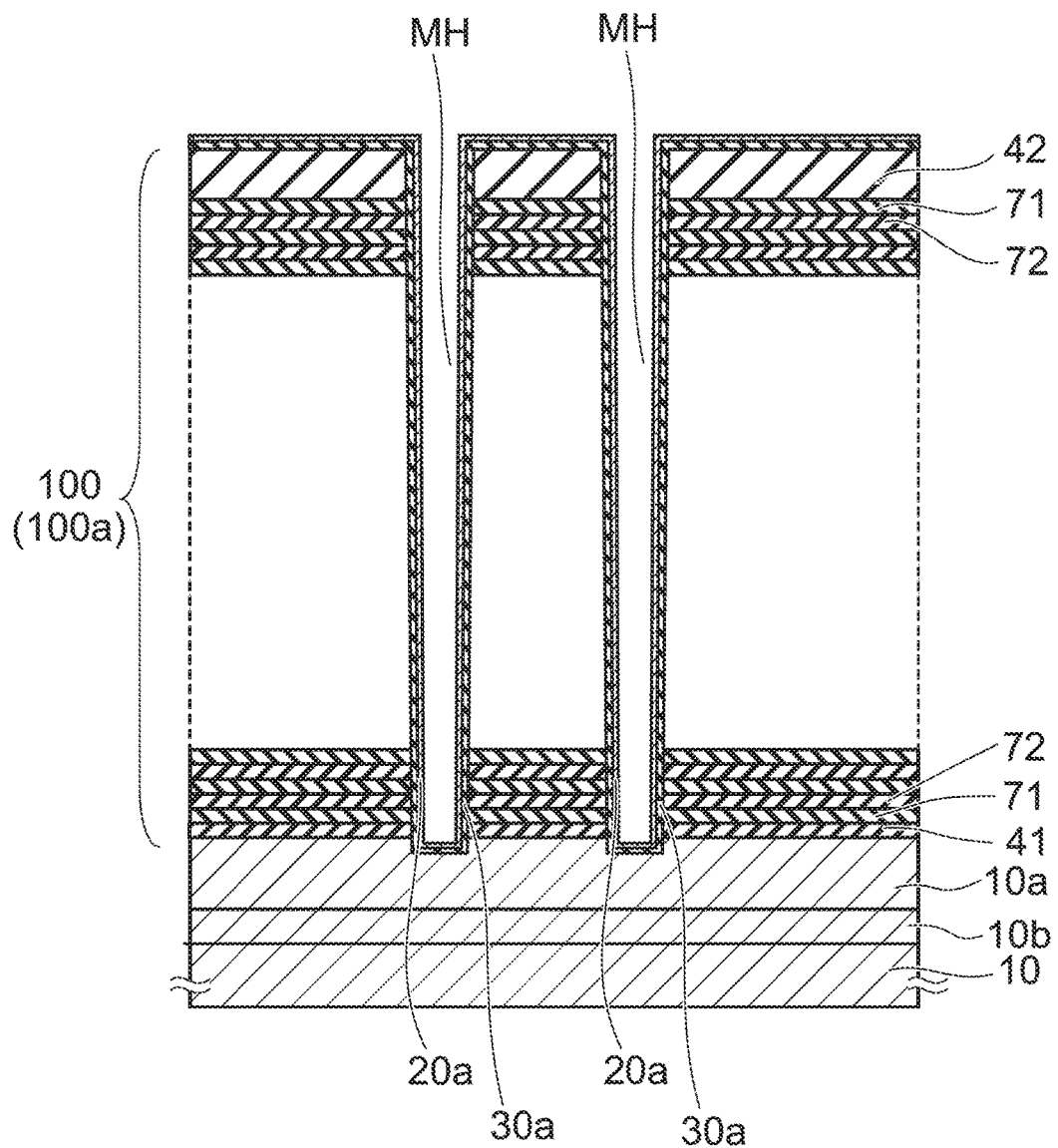

As shown in FIG. 13, cover silicon 20a is formed on the inner side of the stacked film 30a. The cover silicon 20a is formed conformally along the bottoms and side surfaces of the memory holes MH.

Figure 14:
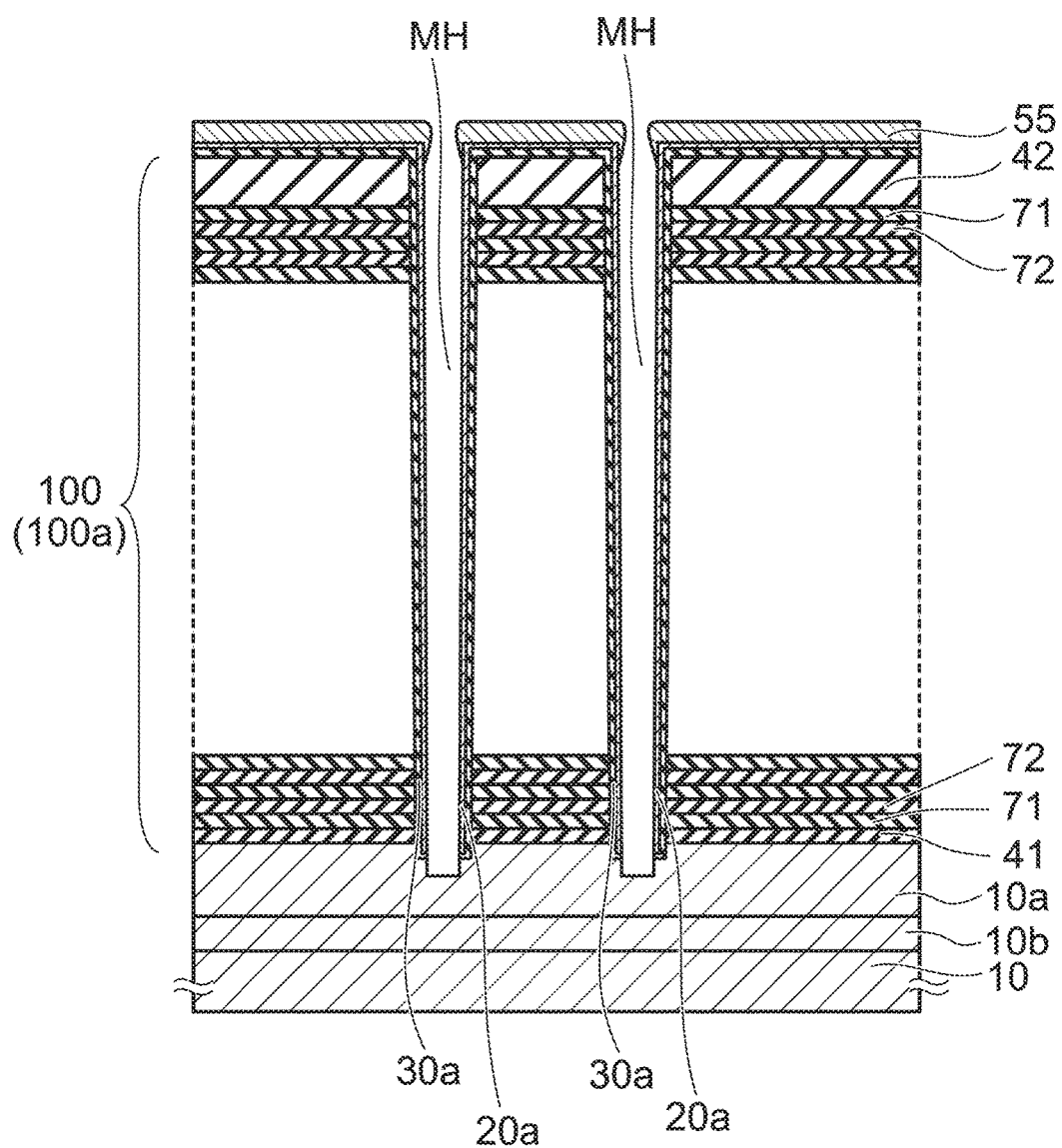

Then, as shown in FIG. 14, a mask layer 55 is formed on the insulating layer 42; and the cover silicon 20a and the stacked film 30a that are deposited on the bottoms of the memory holes MH are removed by RIE. In the RIE, the stacked film 30a that is formed on the side surfaces of the memory holes MH is covered with and protected by the cover silicon 20a and is not damaged by the RIE.

Figure 15:
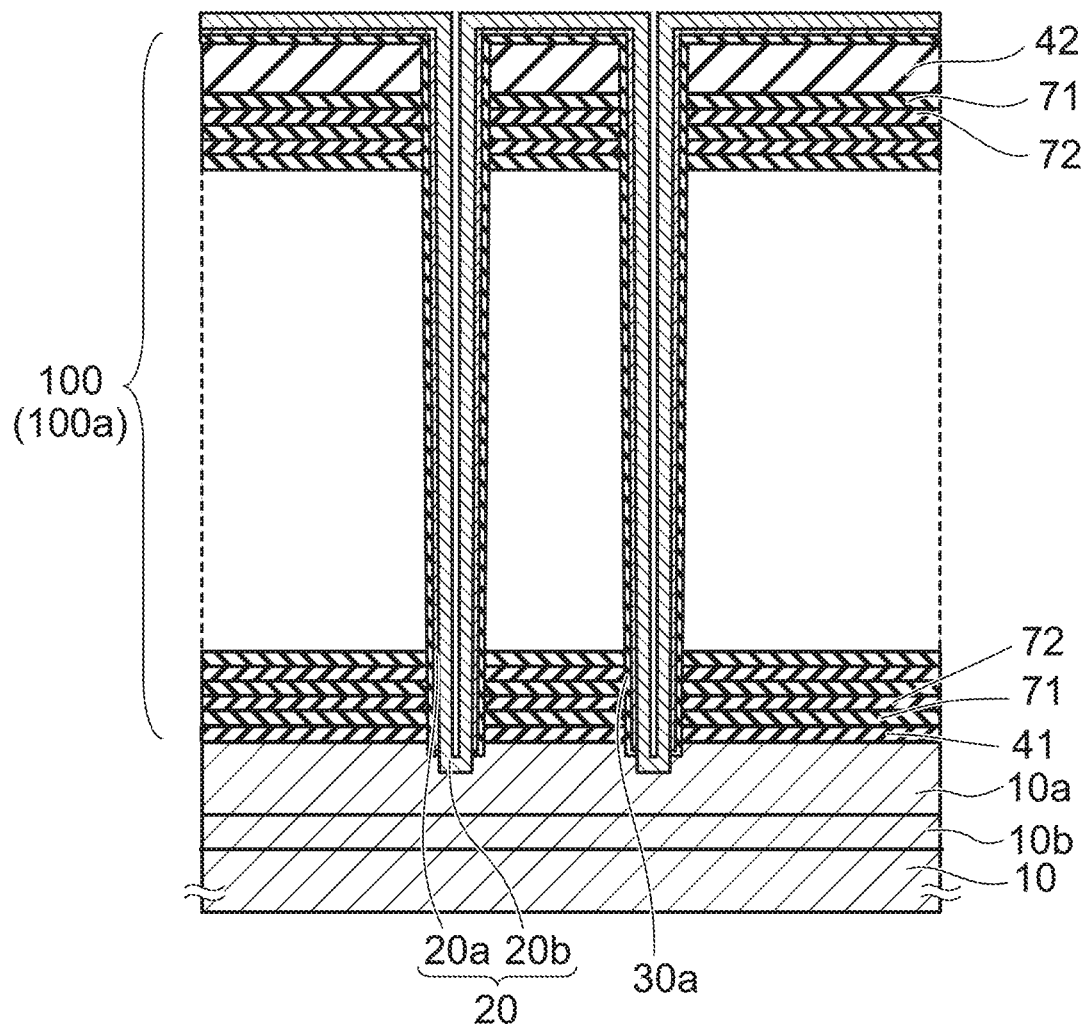

After removing the mask layer 55, a silicon body 20b is formed inside the memory holes MH as shown in FIG. 15. The silicon body 20b is formed on the side surface of the cover silicon 20a and the first semiconductor region 10a at the bottoms of the memory holes MH. The lower end portion of the silicon body 20b contacts the first semiconductor region 10a.

For example, the cover silicon 20a and the silicon body 20b are formed as amorphous silicon films and subsequently crystallized into polycrystalline silicon films by heat treatment.

Figure 16:
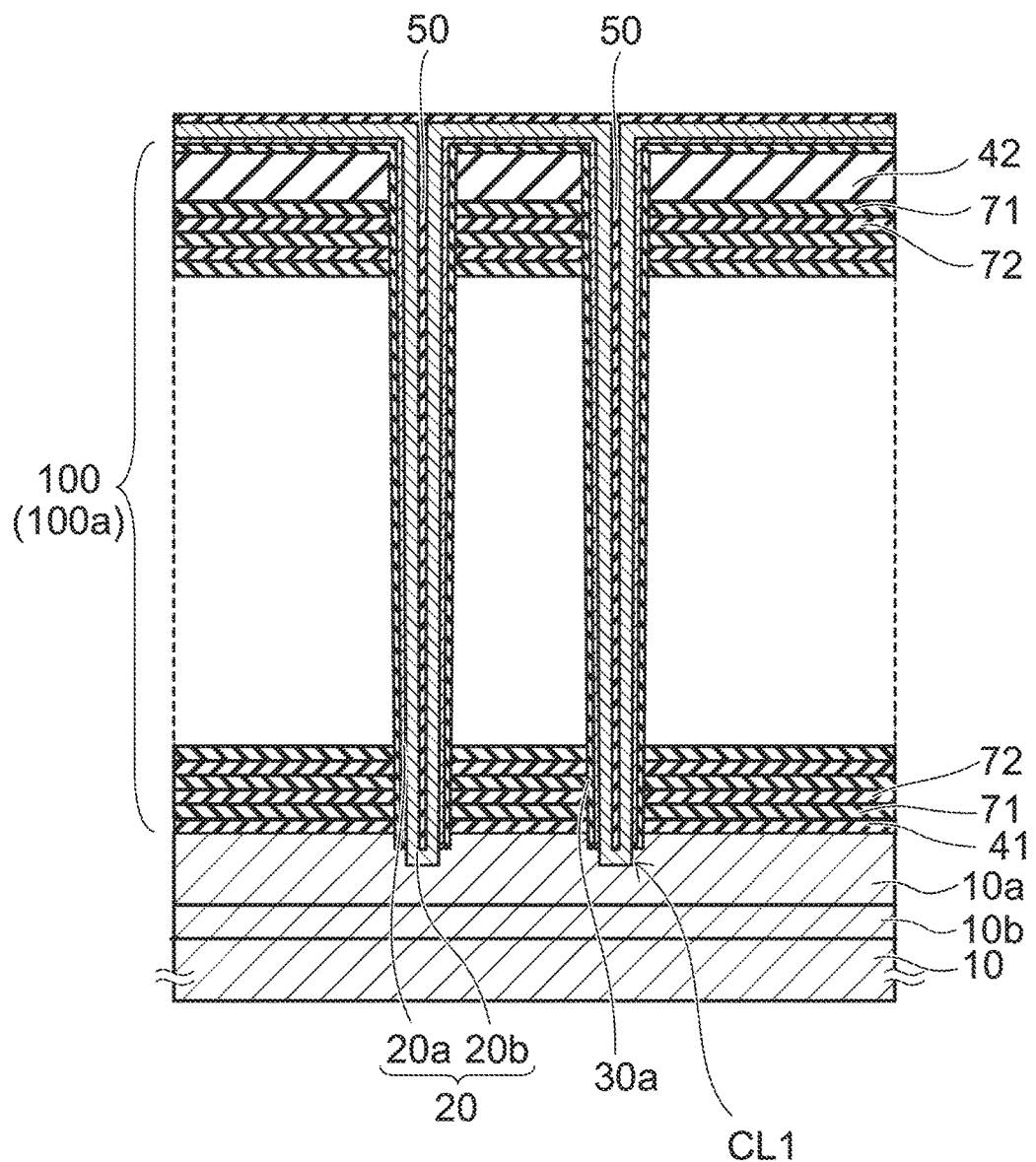

As shown in FIG. 16, the core film 50 is formed on the inner side of the silicon body 20b. The multiple first columnar portions CL1 that include the stacked film 30a, the semiconductor body 20, and the core film 50 are formed inside the first stacked portion 100a.

The films that are deposited on the insulating layer 42 shown in FIG. 16 are removed by chemical mechanical polishing (CMP) or etch-back.

Figure 17:
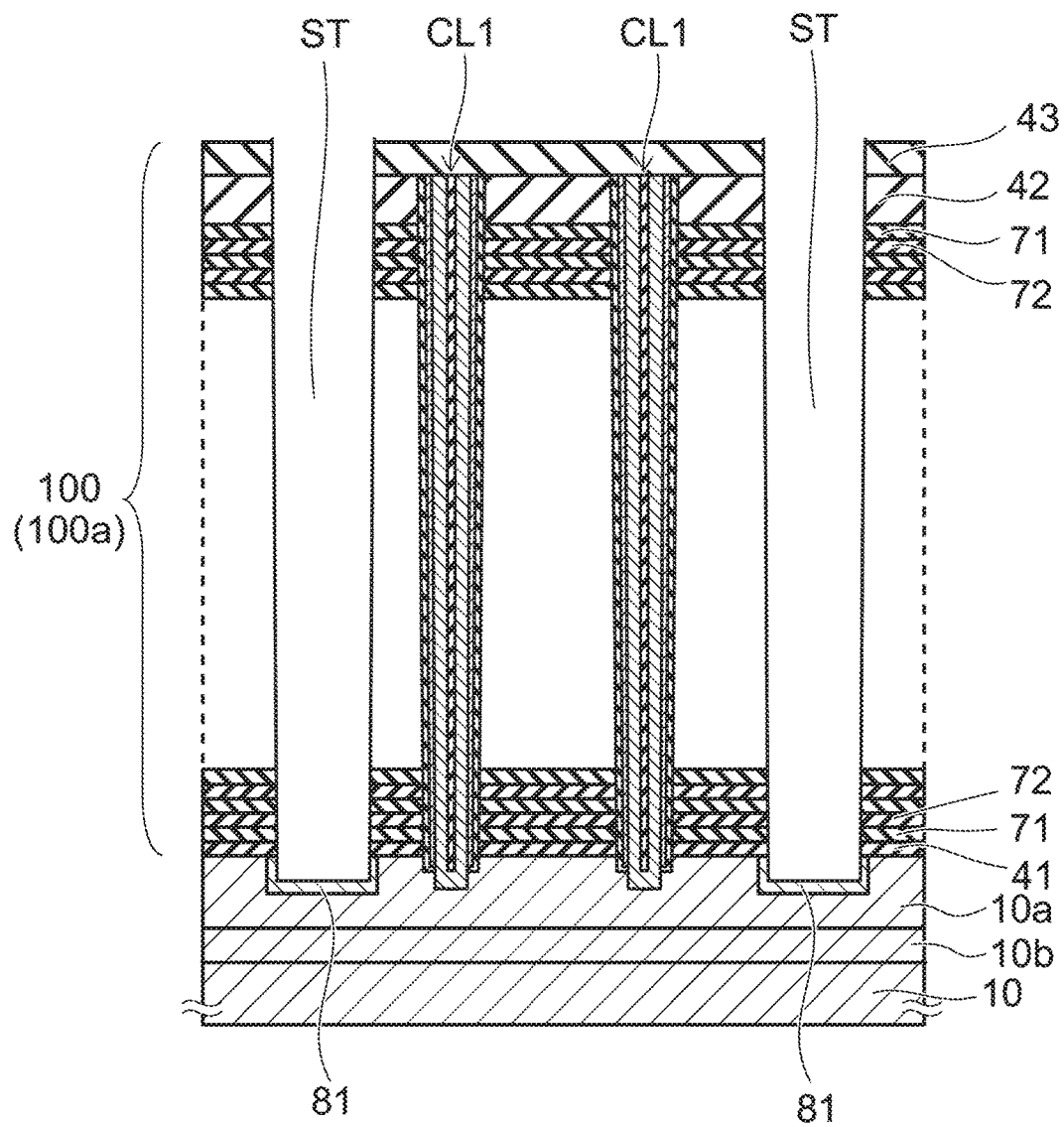

Subsequently, as shown in FIG. 17, the insulating layer 43 is formed on the insulating layer 42. The insulating layer 43 covers the upper ends of the first columnar portions CL1.

Then, multiple slits ST are formed in the first stacked portion 100a by RIE using a not-illustrated mask layer. The slits ST pierce the insulating layer 43, the insulating layer 42, the multiple sacrificial layers 71, the multiple insulating layers 72, and the insulating layer 41 and reach the first semiconductor region 10a. The slits ST extend in the X-direction and are formed also in the second stacked portion 100b of the terrace region TA and the insulating layer 45 on the second stacked portion 100b.

An impurity is implanted into the first semiconductor region 10a exposed at the bottoms of the slits ST by ion implantation; and the N-type or P-type semiconductor regions 81 are formed in the front surface of the first semiconductor region 10a at the bottoms of the slits ST.

Then, the sacrificial layers 71 are removed using an etchant or an etching gas supplied via the slits ST. For example, the sacrificial layers 71 which are silicon nitride layers are removed using an etchant including phosphoric acid.

Figure 18:
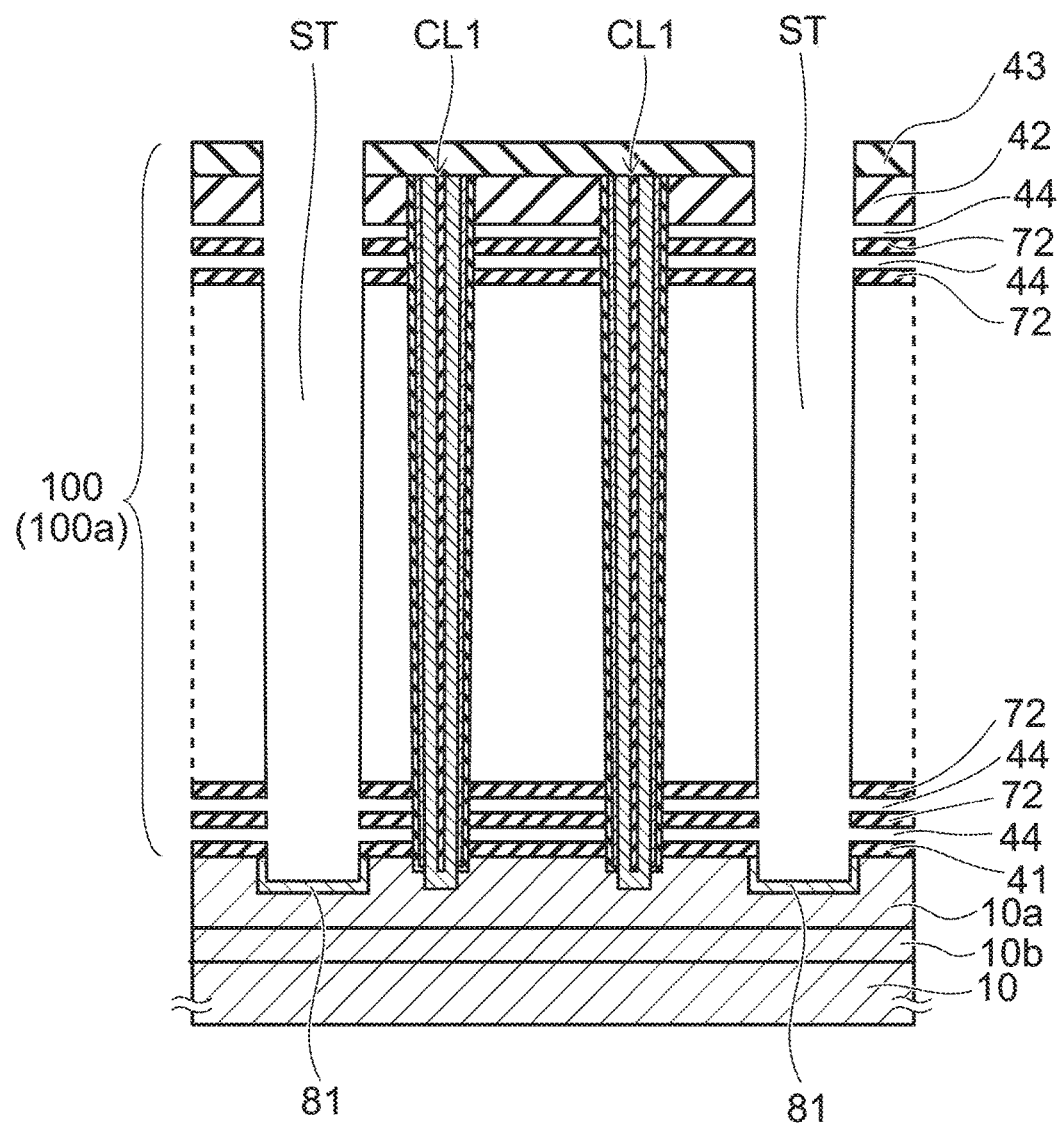

The sacrificial layers 71 are removed; and as shown in FIG. 18, gaps 44 are formed between the insulating layers 72 adjacent to each other above and below. The gap 44 is formed also between the insulating layer 41 and the insulating layer 72 of the lowermost layer and between the insulating layer 72 of the uppermost layer and the insulating layer 42.

The multiple insulating layers 72 of the first stacked portion 100a contact the side surfaces of the multiple first columnar portions CL1 to surround the side surfaces of the first columnar portions CL1. The multiple insulating layers 72 are supported by such a physical bond with the multiple first columnar portions CL1; and the gaps 44 are maintained between the insulating layers 72.

Figure 19:
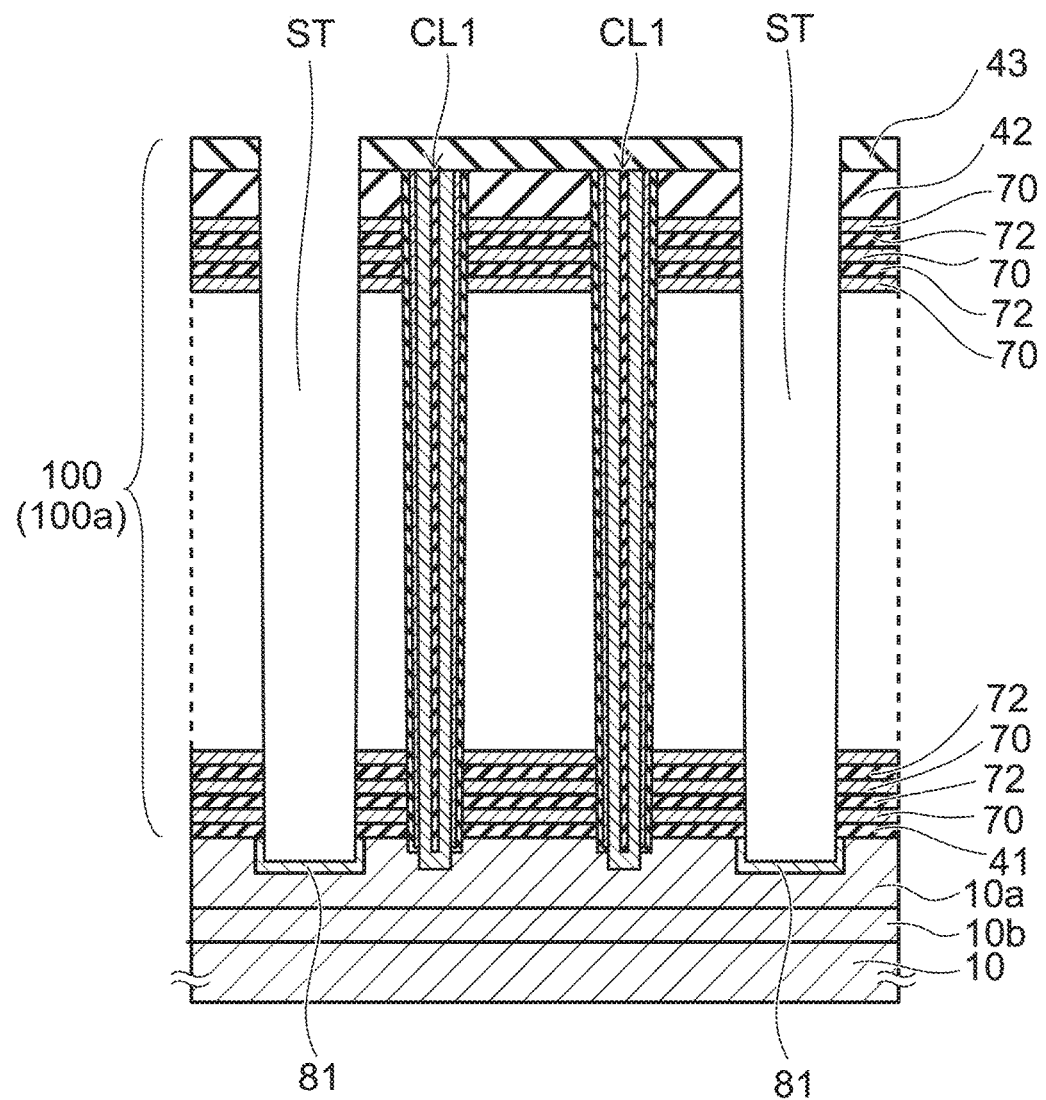

The electrode layers 70 shown in FIG. 19 are formed, with the second blocking films 35 shown in FIG. 5A interposed, in the gaps 44. For example, the second blocking films 35 and the electrode layers 70 are formed by chemical vapor deposition (CVD). A source gas is supplied to the gaps 44 via the slits ST. The electrode layers 70 that are formed on the side surfaces of the slits ST are removed.

Figure 20:
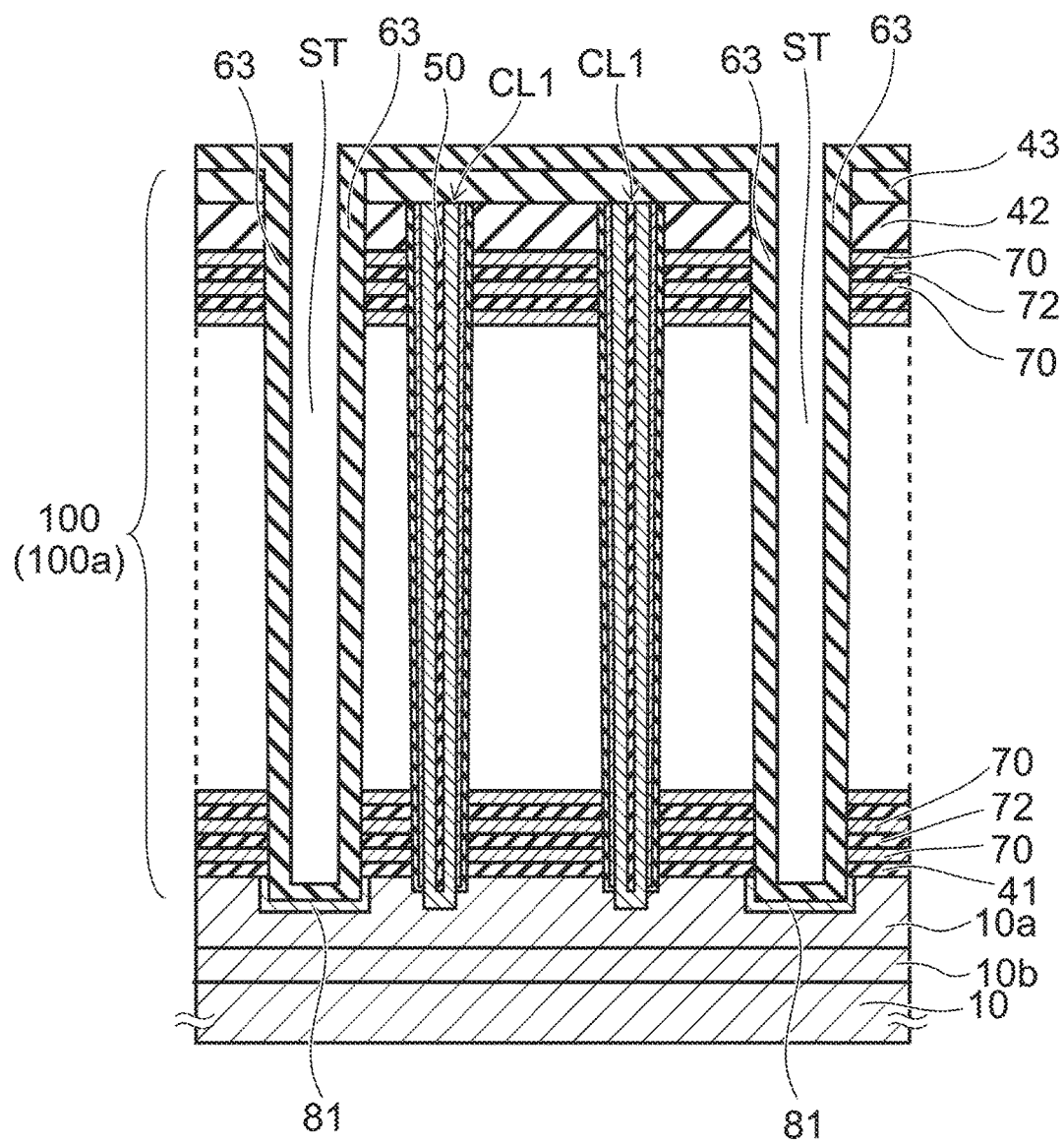

Subsequently, as shown in FIG. 20, the insulating film 63 is formed on the bottoms and side surfaces of the slits ST. After removing the insulating film 63 formed on the bottoms of the slits ST by RIE, the interconnect portion LI is filled into the inner side of the insulating film 63 inside the slits ST as shown in FIG. 4. The lower end portion of the interconnect portion LI contacts the first semiconductor region 10a via the semiconductor region 81.

The processes for the second stacked portion 100b of the terrace region TA will now be described with reference to FIG. 21 to FIG. 25. FIG. 21 to FIG. 25 are cross-sectional views corresponding to the B-B' cross section of FIG. 2.

The first insulating portion 51, the second insulating portion 52, and the third insulating portion 53 that have the STI structures described above are formed in the first semiconductor region 10a prior to forming the stacked body 100.

Figure 21:
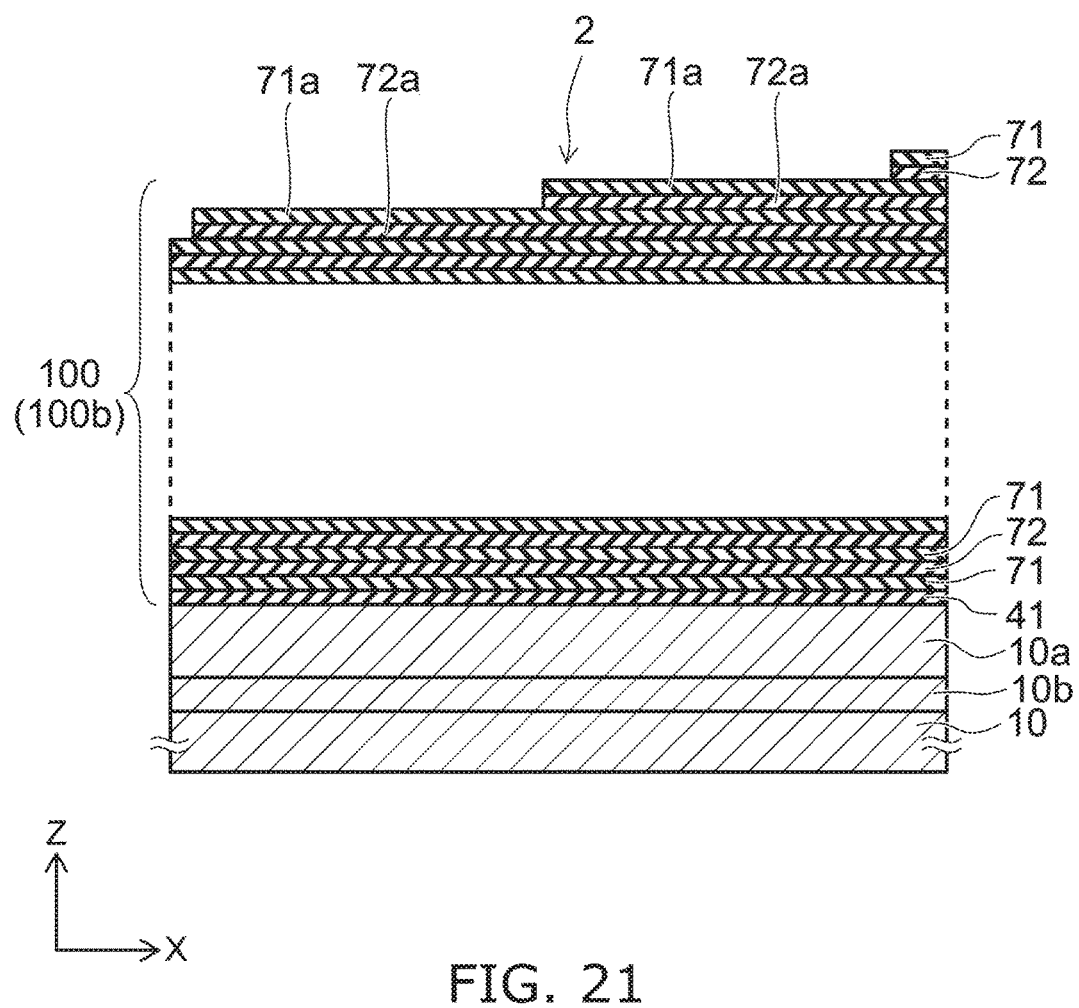

Subsequently, processes similar to those of the memory region MA are continued; and the staircase portion 2 is formed in a portion of the second stacked portion 100b as shown in FIG. 21 prior to forming the memory holes MH in the stacked body 100.

For example, RIE using a not-illustrated resist film as a mask and the reduction of the planar size of the resist film are repeated; and the multiple sacrificial layers 71 and the multiple insulating layers 72 are patterned into a staircase configuration along the X-direction. The multiple terrace portions 71a of the multiple sacrificial layers 71 are exposed at the uppermost surface of the staircase portion 2. The multiple terrace portions 71a are arranged to have a level difference in the X-direction. The terrace portions 72a of the insulating layers 72 are stacked under the terrace portions 71a.

Figure 22:
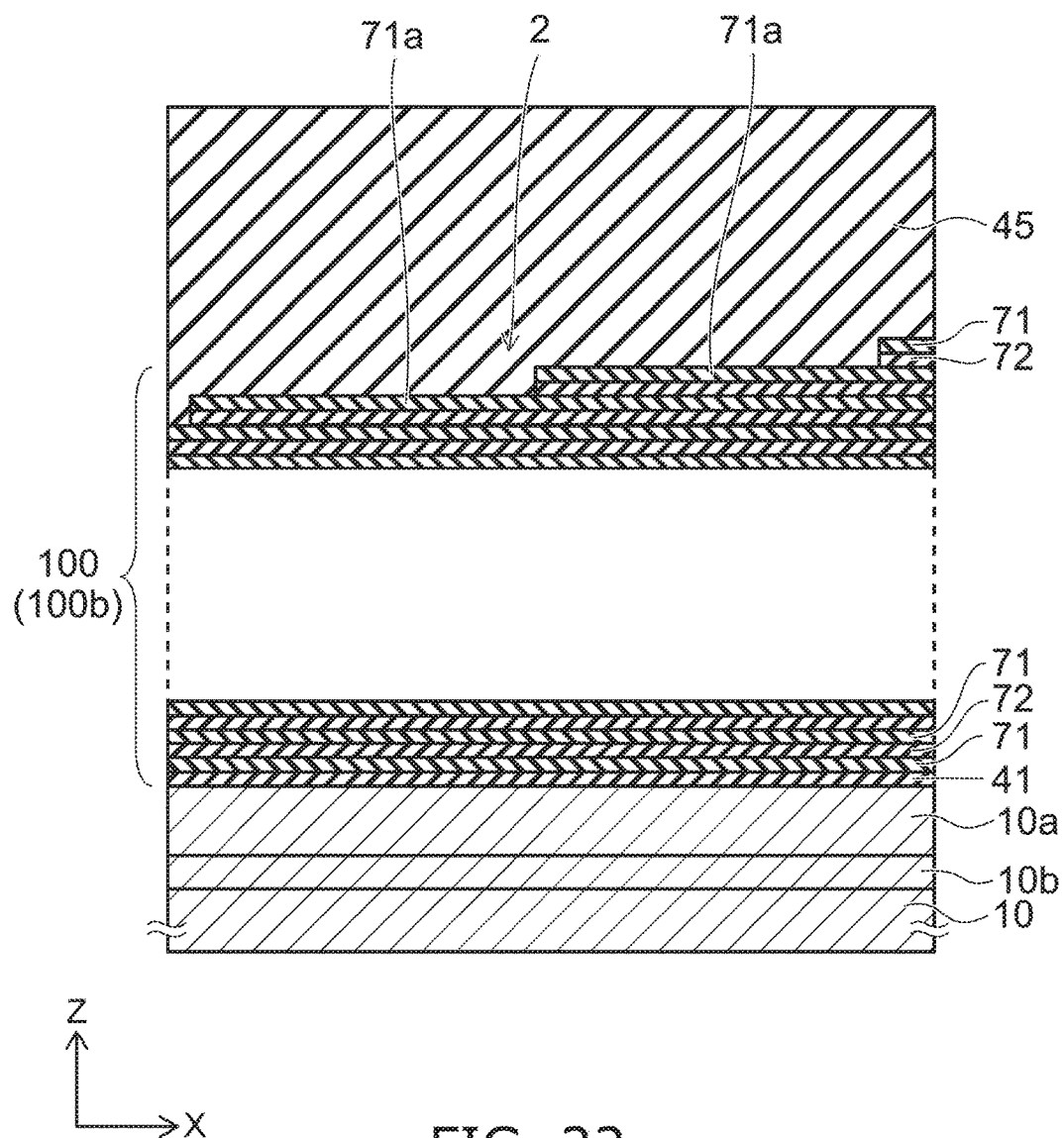

As shown in FIG. 22, the insulating layer 45 is formed on the staircase portion 2. The insulating layer 45 fills the level differences of the staircase portion 2; and the upper surface of the insulating layer 45 is planarized.

Figure 23:
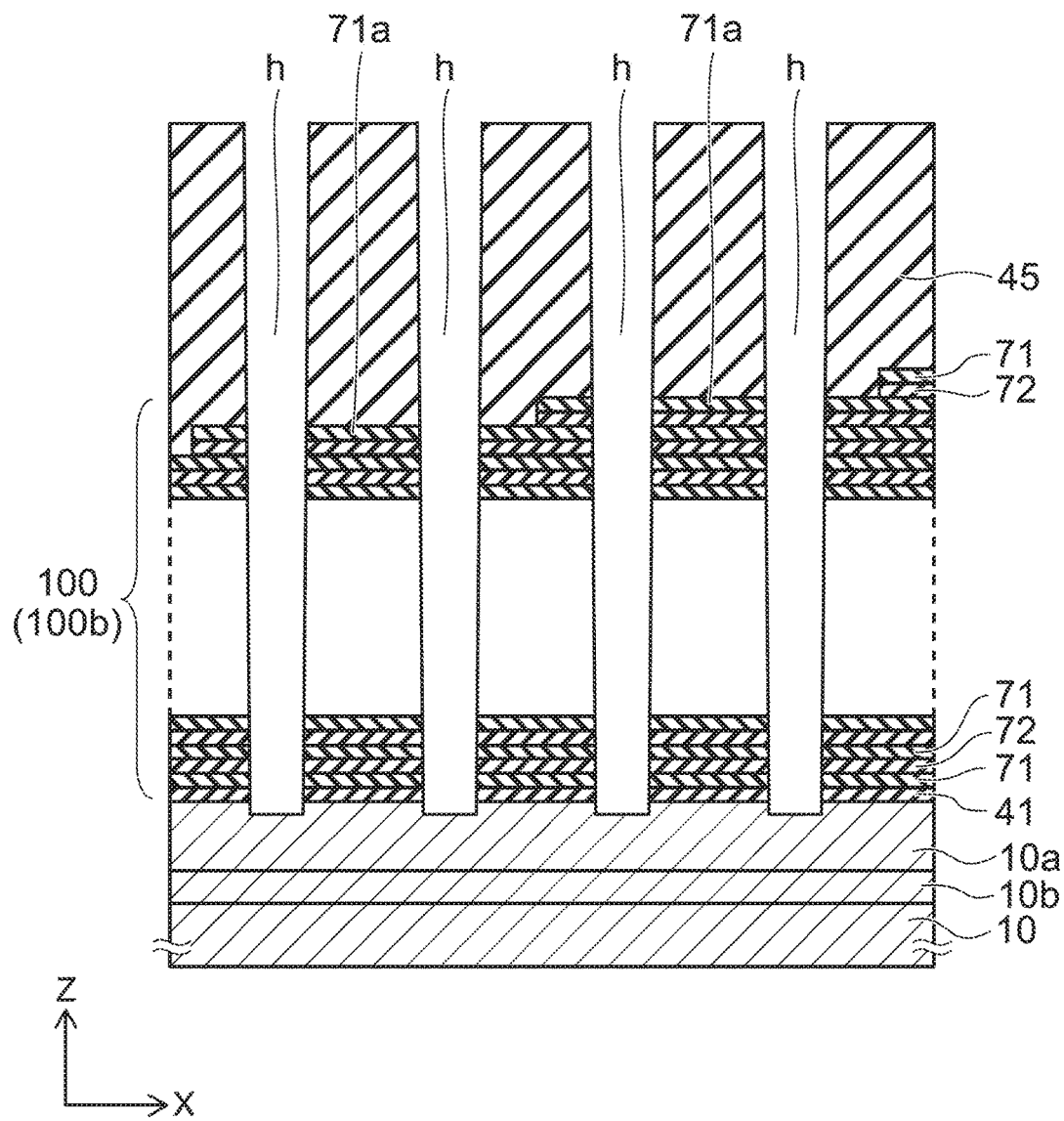

Then, as shown in FIG. 23, multiple holes h are formed in the insulating layer 45 and in the second stacked portion 100b under the insulating layer 45. The holes h are formed simultaneously when forming the memory holes MH shown in FIG. 11. In other words, the multiple memory holes MH and the multiple holes h are formed simultaneously by RIE. The holes h extend through the insulating layer 45 and through the second stacked portion 100b in the Z-direction and reach the first semiconductor region 10a.

Figure 24:
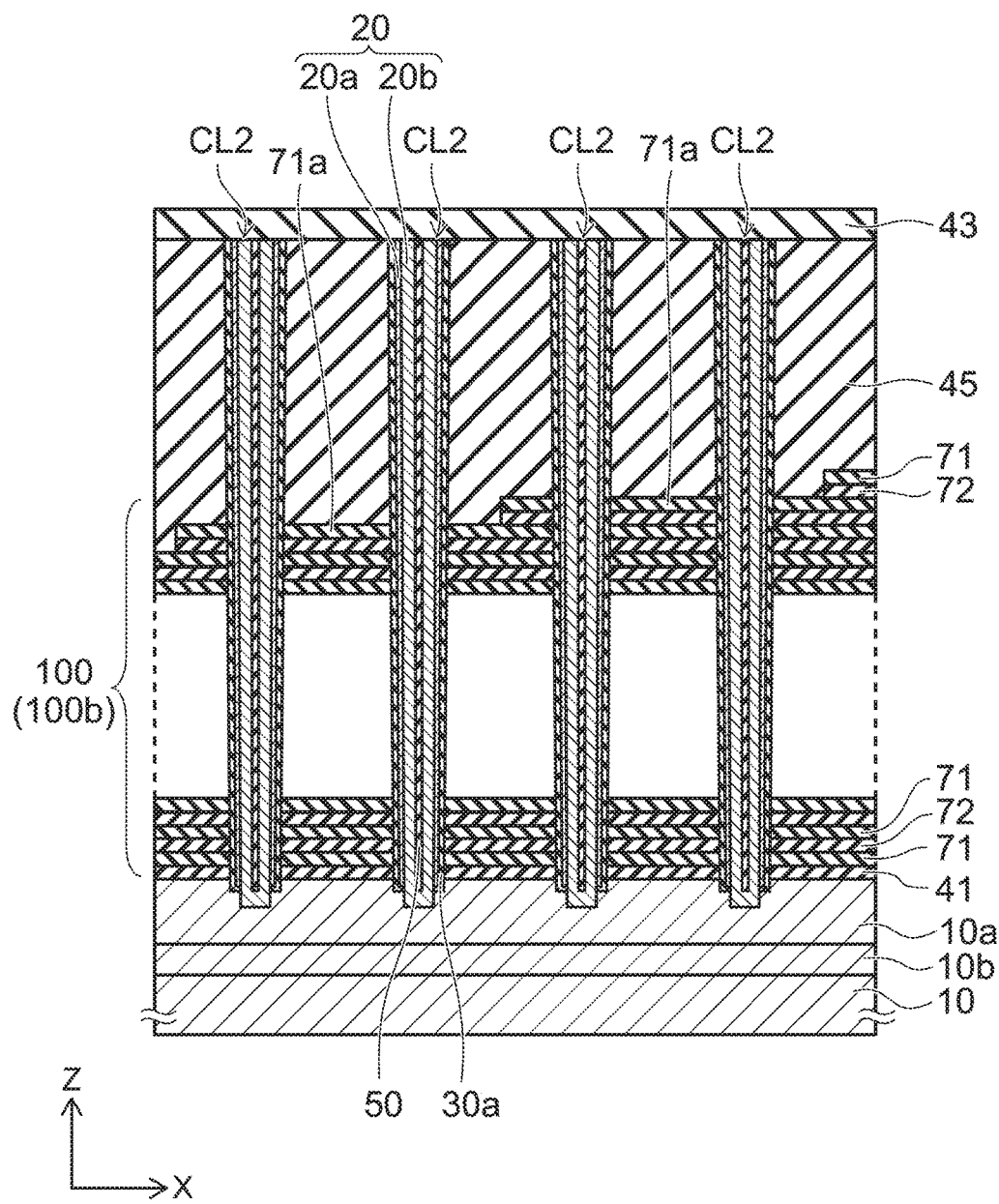

The second columnar portions CL2 shown in FIG. 24 that have the same film structure as the first columnar portions CL1 inside the memory holes MH are formed also inside the holes h. In other words, the stacked film 30a, the semiconductor body 20, and the core film 50 are formed also inside the holes h simultaneously when forming the stacked film 30a, the semiconductor body 20, and the core film 50 inside the memory holes MH.

The insulating layer 43 is formed on the insulating layer 45 as shown in FIG. 24; and the insulating layer 43 covers the upper ends of the second columnar portions CL2.

Subsequently, the slits ST that extend in the X-direction are formed in the stacked body including the first stacked portion 100a of the memory region MA and the insulating layer 45 and the second stacked portion 100b of the terrace region TA.

Figure 25:
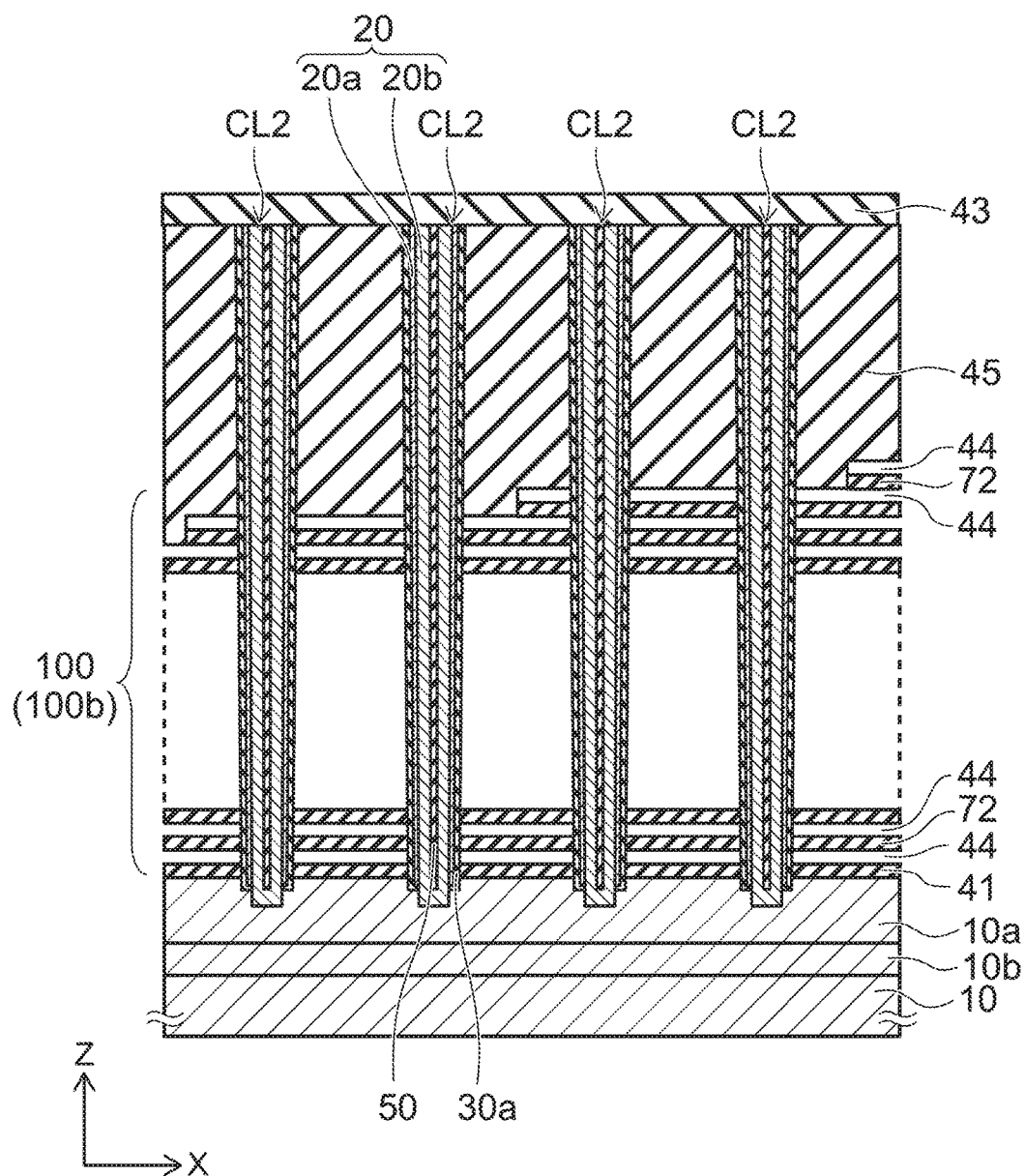

Then, the sacrificial layers 71 of the first stacked portion 100a and the second stacked portion 100b are removed using, for example, an etchant including phosphoric acid supplied via the slits ST. The sacrificial layers 71 are removed; and the gaps 44 shown in FIG. 25 are formed also in the second stacked portion 100b.

The outermost film of the stacked film 30a of the first columnar portions CL1 and the second columnar portions CL2 is the first blocking film 34. The first blocking film 34 is a silicon oxide film of a material that is different from the silicon nitride layer of the sacrificial layer 71 and has resistance for the etching conditions when removing the sacrificial layers 71. Accordingly, the first columnar portions CL1 and the second columnar portions CL2 remain without being etched when removing the sacrificial layers 71.

The multiple insulating layers 72 of the second stacked portion 100b contact the side surfaces of the multiple second columnar portions CL2 to surround the side surfaces of the second columnar portions CL2. The multiple insulating layers 72 are supported by such a physical bond with the multiple second columnar portions CL2; and the gaps 44 are maintained between the insulating layers 72.

Then, the electrode layers 70 are formed also in the gaps 44 of the second stacked portion 100b as shown in FIG. 6 simultaneously when forming the electrode layers 70 in the gaps 44 of the first stacked portion 100*a*.

Also, similarly to the first stacked portion 100*a*, the second blocking films 35 shown in FIG. 5A are interposed between the electrode layers 70 and the second columnar portions CL2 and between the electrode layers 70 and the insulating layers 72 of the second stacked portion 100*b*.

Subsequently, the interconnect portions LI are formed, with the insulating films 63 interposed, also inside the slits ST of the terrace region TA.

Subsequently, the contact portions 91 shown in FIG. 7 are formed by forming contact holes inside the insulating layer 45 and by filling a conductive material including a metal into the contact holes CH.

Figure 26:
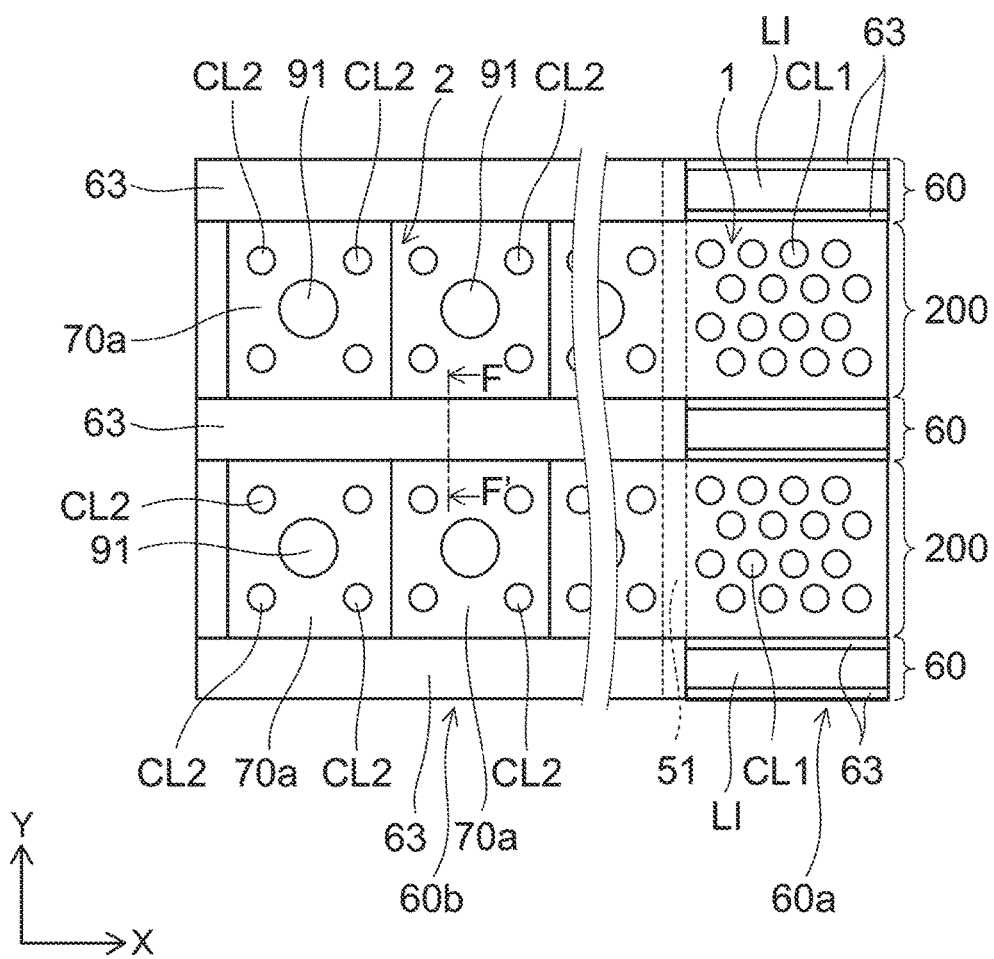
FIG. 26 is a schematic plan view of the semiconductor device of the embodiment.

FIG. 26 is a schematic plan view similar to FIG. 2 showing another example of the separation portion 60.

Figure 27:
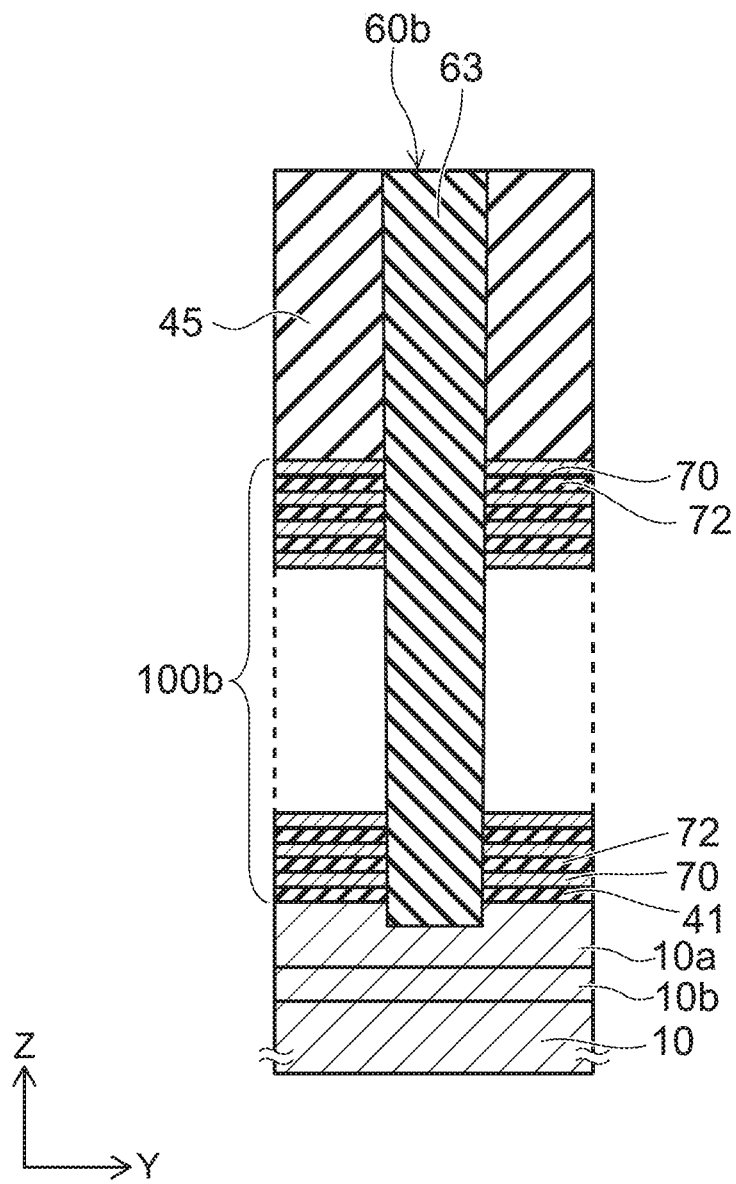
FIG. 27 is a F-F' cross-sectional view of FIG. 26.

FIG. 27 is an F-F' cross-sectional view of FIG. 26.

A separation portion 60*d* shown in FIG. 26 includes a first portion 60*a* dividing the first stacked portion 100*a* of the memory cell array 1, and a second portion 60*b* dividing the second stacked portion 100*b* of the terrace region TA.

The first portion 60*a* includes the interconnect portion LI; but the second portion 60*b* does not include the interconnect portion LI. As shown in FIG. 27, the second portion 60*b* of the separation portion 60 is formed of the insulating film 63. With the first insulating portion 51 as a boundary, the interconnect portion LI is provided in the separation portion 60 of the memory region MA; and the interconnect portion LI is not provided in the separation portion 60 of the terrace region TA.

Accordingly, the semiconductor bodies 20 of the second columnar portions CL2 contacting the first semiconductor region 10*a* under the terrace portions 70*a* are electrically isolated from the interconnect portions LI of the memory region MA.

After replacing the sacrificial layers 71 with the electrode layers 70, the insulating layers 72 may be removed by etching via the slits ST. For example, the insulating layers 72 which are silicon oxide layers can be removed using an etchant including hydrofluoric acid.

Figure 28A:
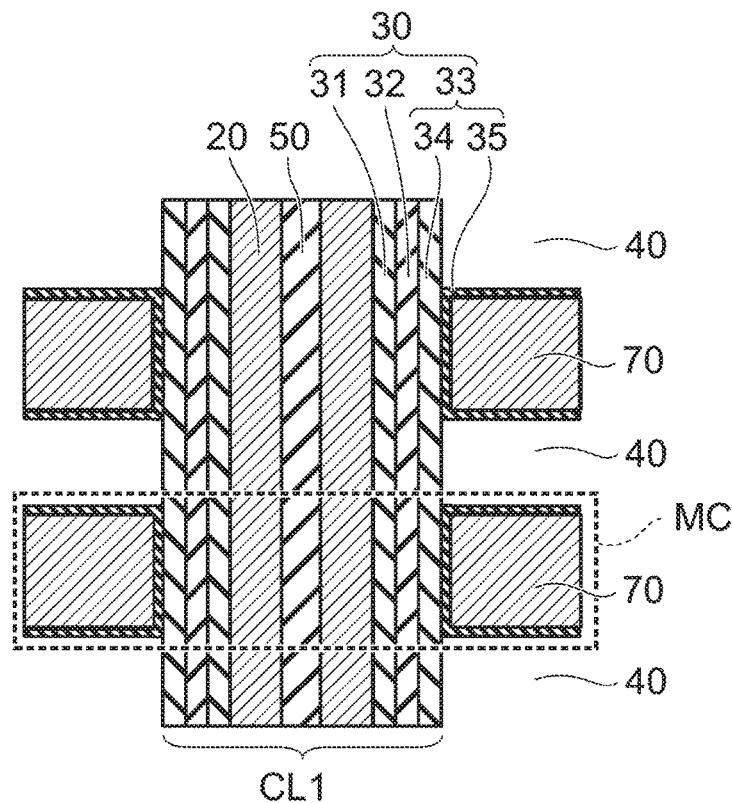
FIG. 28A and FIG. 28B are schematic cross-sectional views of a memory cell of the semiconductor device of the embodiment.

The insulating layers 72 are removed; and gaps 40 are formed between the electrode layers 70 adjacent to each other above and below as shown in FIG. 28A. The multiple electrode layers 70 are supported by the physical bond with the columnar portions CL1 and CL2; and the gaps 40 between the electrode layers 70 are maintained.

The gaps 40 are formed as insulating bodies between the electrode layers 70 which are the control gates of the memory cells MC adjacent to each other in the stacking direction. The gaps 40 which have a dielectric constant lower than that of an insulating film such as a silicon oxide film, etc., reduce the interconnect capacitance between the electrode layers 70 above and below and make high-speed operations of the memory cells MC possible. Further, interference between adjacent cells such as threshold fluctuation due to the capacitive coupling between the electrode layers 70 above and below, etc., can be suppressed.

Also, after forming the columnar portions CL1 and CL2 in the stacked body including the multiple first layers (the electrode layers) and the multiple second layers (the sacrificial layers) stacked alternately, the gaps 40 may be formed between the first layers by removing the second layers. For example, metal layers can be used as the first layers; and an insulating layer or a metal layer of a material different from the first layers can be used as the second layers.

Figure 28B:
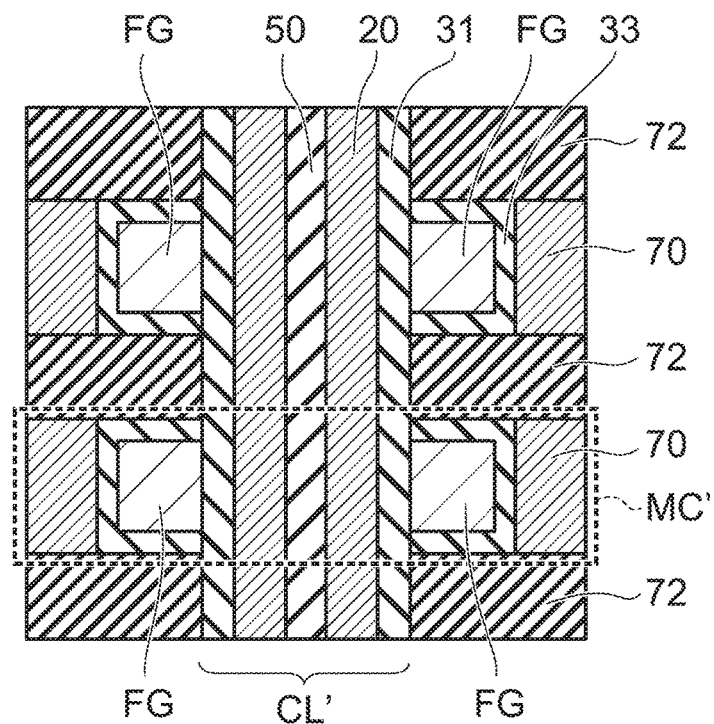

FIG. 28B is a schematic cross-sectional view of another example of the memory cell of the embodiment.

A memory cell MC' shown in FIG. 28B includes a floating gate FG as the charge storage portion. The floating gate FG includes, for example, mainly polycrystalline silicon. The floating gate FG is provided between a columnar portion CL' and the electrode layer 70.

The columnar portion CL' includes the semiconductor body 20 provided between the tunneling insulating film 31, the core film 50, the tunneling insulating film 31, and the core film 50 and is formed inside the memory hole MH described above. The tunneling insulating film 31, the semiconductor body 20, and the core film 50 are formed in order inside the memory hole MH.

The floating gate FG is provided between the electrode layer 70 and the tunneling insulating film 31 which is the outermost circumferential portion of the columnar portion CL'. The floating gate FG contacts the tunneling insulating film 31.

The blocking insulating film 33 is provided between the floating gate FG and the electrode layer 70. The blocking insulating film 33 is provided also between the floating gate FG and the insulating layer 72. The multiple floating gates FG are arranged to be separated in the stacking direction of the stacked body 100.

FIG. 29 to FIG. 32 are schematic cross-sectional views of the memory region MA and the terrace region TA of the semiconductor device of the embodiment.

In the example shown in FIG. 29, the P-type well 10*a* and the N-type well 10*b* are not provided in the terrace region TA.

The semiconductor body 20 of the first columnar portion CL1 contacts the P-type well 10*a* and the semiconductor body 20 of the second columnar portion CL2 contacts the surface of the P-type substrate 10 (P-type region).

About 20V as the erase voltage is applied to the P-type well 10*a*. About 20V as the erase voltage is applied to the N-type well 10*b*. At this time, 0V is applied to the substrate 10.

The P-type well 10*a* that is in contact with the semiconductor body 20 of the first columnar portion CL1 and the surface of the P-type substrate 10 (P-type region) that is in contact with the semiconductor body 20 of the second columnar portion CL2 are electrically isolated. Therefore, the erase voltage stress is not applied to the second columnar portions CL2. This suppresses the operation errors due to the dielectric breakdown of the second columnar portions CL2.

Figure 30:
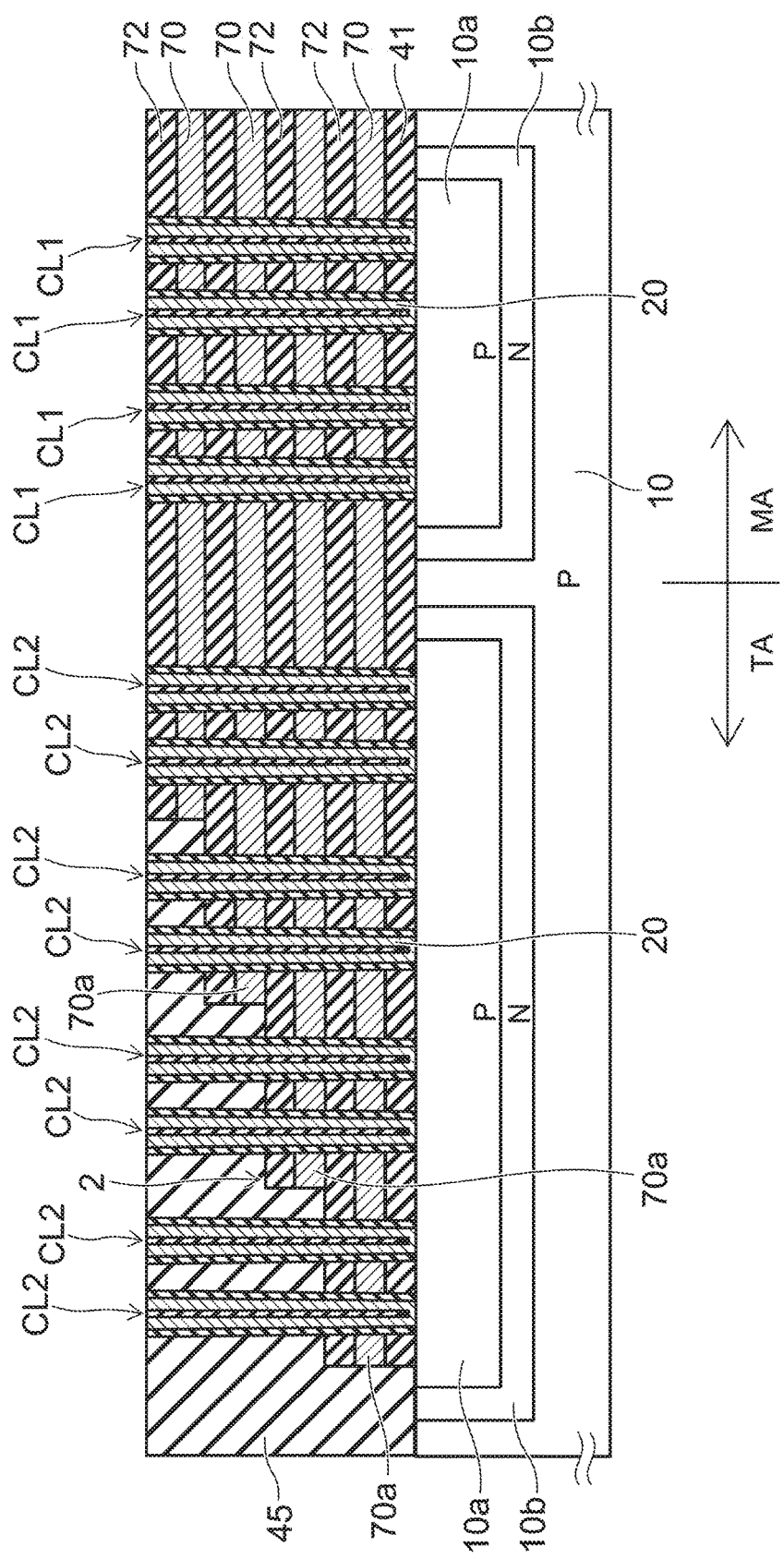

In the example shown in FIG. 30, the P-type well 10*a* provided in the memory region MA and the P-type well 10*a* provided in the terrace region TA are separated from each other. The N-type well 10*b* provided in the memory region MA and the N-type well 10*b* provided in the terrace region TA are separated from each other.

The semiconductor body 20 of the first columnar portion CL1 contacts the P-type well 10*a* provided in the memory region MA, and the semiconductor body 20 of the second columnar portion CL2 contacts the P-type well 10*a* provided in the terrace region TA.

About 20V as the erase voltage is applied to the P-type well 10*a* of the memory region MA, and about 20V as the erase voltage is applied to the N-type well 10*b* of the memory region MA. At this time, 0V is applied to the P-type well 10*a* and the N-type well 10*b* of the terrace region TA, and 0V is applied to the substrate 10.

The P-type well 10*a* that is in contact with the semiconductor body 20 of the first columnar portion CL1 and the P-type well 10*a* that is in contact with the semiconductor body 20 of the second columnar portion CL2 are electrically isolated. Therefore, the erase voltage stress is not applied to the second columnar portions CL2. This suppresses the operation errors due to the dielectric breakdown of the second columnar portions CL2.

Figure 31:
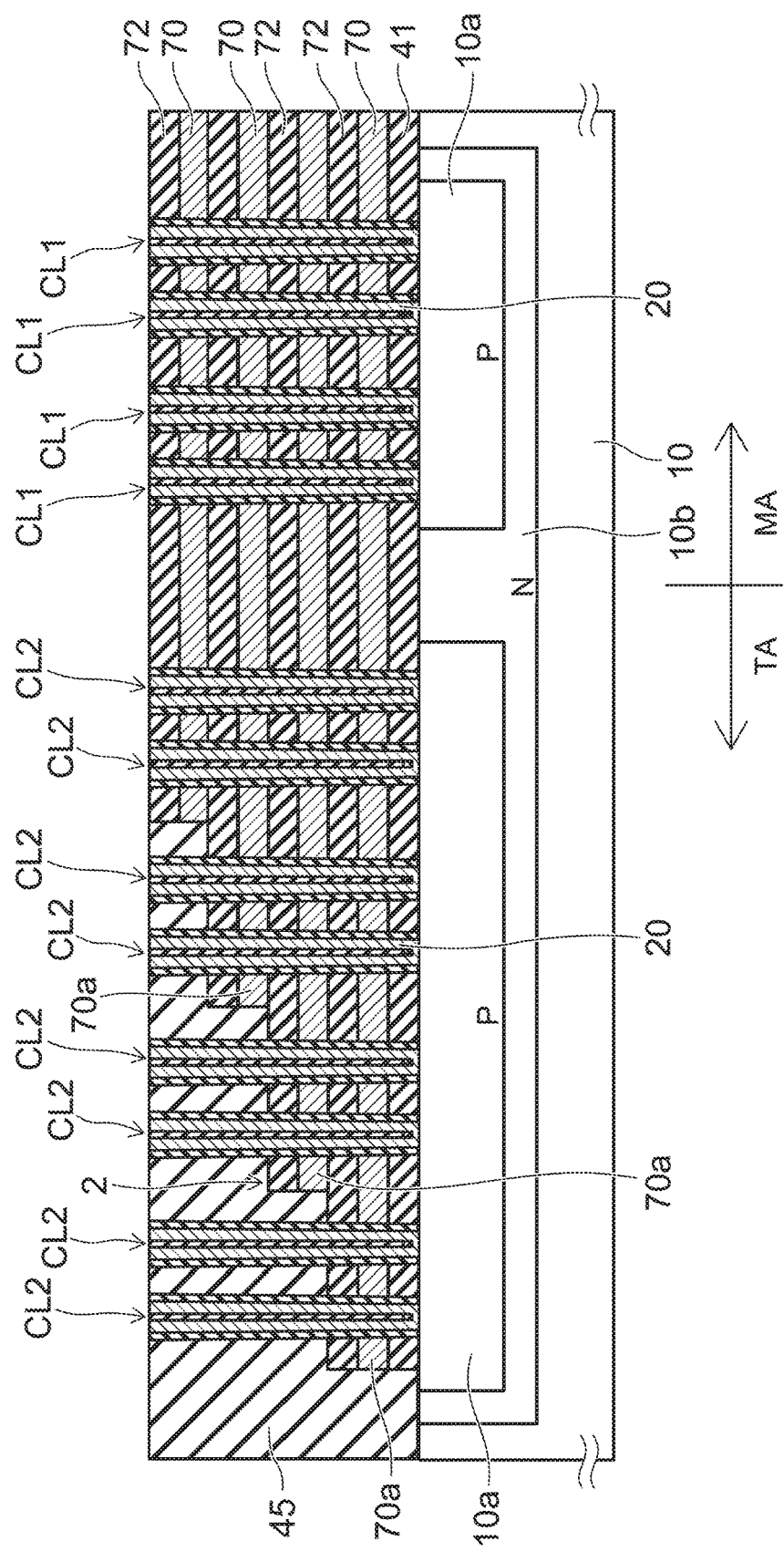

In the example shown in FIG. 31, the P-type well 10a provided in the memory region MA and the P-type well 10a provided in the terrace region TA are separated from each other. the P-type well 10a provided in the memory region MA and the P-type well 10a provided in the terrace region TA are provided in the N-type well 10b. The N-type well 10b in the memory region MA and the N-type well 10b in the terrace region TA are continuous.

The semiconductor body 20 of the first columnar portion CL1 contacts the P-type well 10a provided in the memory region MA, and the semiconductor body 20 of the second columnar portion CL2 contacts the P-type well 10a provided in the terrace region TA.

About 20V as the erase voltage is applied to the P-type well 10a of the memory region MA, and about 20V as the erase voltage is applied to the N-type well 10b of the memory region MA. At this time, 0V is applied to the P-type well 10a of the terrace region TA, and 0V is applied to the substrate 10.

The P-type well 10a that is in contact with the semiconductor body 20 of the first columnar portion CL1 and the P-type well 10a that is in contact with the semiconductor body 20 of the second columnar portion CL2 are electrically isolated. Therefore, the erase voltage stress is not applied to the second columnar portions CL2. This suppresses the operation errors due to the dielectric breakdown of the second columnar portions CL2.

In the example shown in FIG. 32, the N-type well 10b provided in the memory region MA and the N-type well 10b provided in the terrace region TA are separated from each other. The P-type well 10a is provided in the N-type well 10b of the memory region MA. The P-type well 10a is not provided in the N-type well 10b of the terrace region TA.

The semiconductor body 20 of the first columnar portion CL1 contacts the P-type well 10a provided in the memory region MA, and the semiconductor body 20 of the second columnar portion CL2 contacts the N-type well 10b provided in the terrace region TA.

About 20V as the erase voltage is applied to the P-type well 10a of the memory region MA, and about 20V as the erase voltage is applied to the N-type well 10b of the memory region MA. At this time, 0V is applied to the N-type well 10b of the terrace region TA, and 0V is applied to the substrate 10.

The P-type well 10a that is in contact with the semiconductor body 20 of the first columnar portion CL1 and the N-type well 10b that is in contact with the semiconductor body 20 of the second columnar portion CL2 are electrically isolated. Therefore, the erase voltage stress is not applied to the second columnar portions CL2. This suppresses the operation errors due to the dielectric breakdown of the second columnar portions CL2.

FIG. 33A to FIG. 35B are schematic cross-sectional views showing a method for manufacturing the semiconductor device shown in FIG. 29.

Figure 33A:
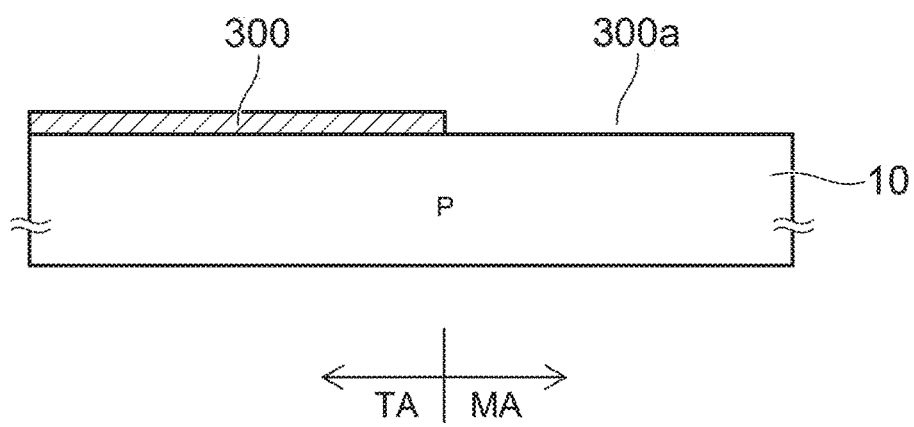
FIG. 33A to FIG. 38C are schematic cross-sectional views showing a method for manufacturing the semiconductor device of the embodiment.

As shown in FIG. 33A, a mask 300 is formed on the surface of the P-type substrate 10. An opening 300a is formed in the mask 300 in the memory region MA by lithography.

Figure 33B:
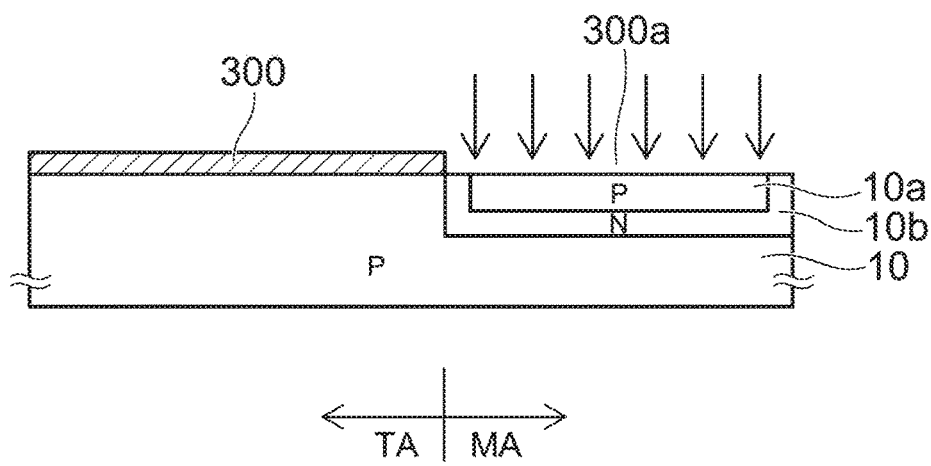

Impurities are implanted into the surface of the substrate 10 in the memory region MA through the opening 300a by ion implantation method. As shown in FIG. 33B, the N-type well 10b and the P-type well 10a are formed in the surface of the substrate 10 in the memory region MA.

Figure 34A:
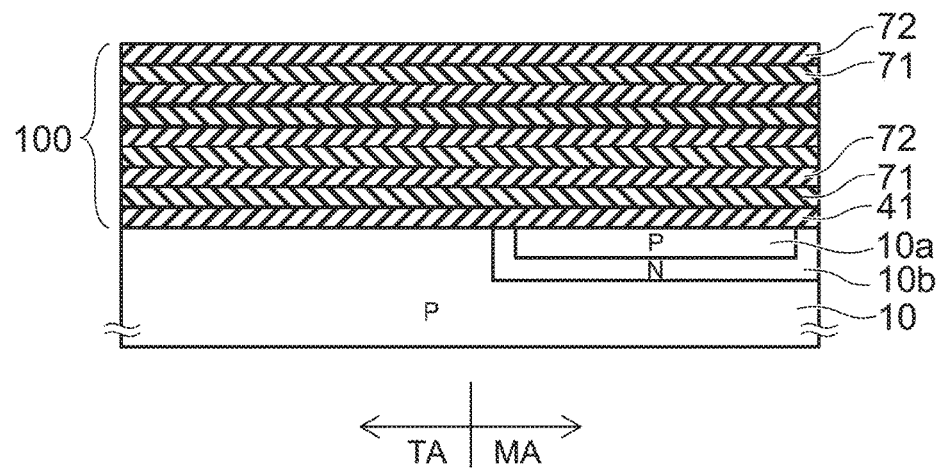

Subsequently, as shown in FIG. 34A, the stacked body 100 including the insulating layer 41, the multiple sacrificial layers 71 and the multiple insulating layers 72 is formed on the substrate 10.

Figure 34B:
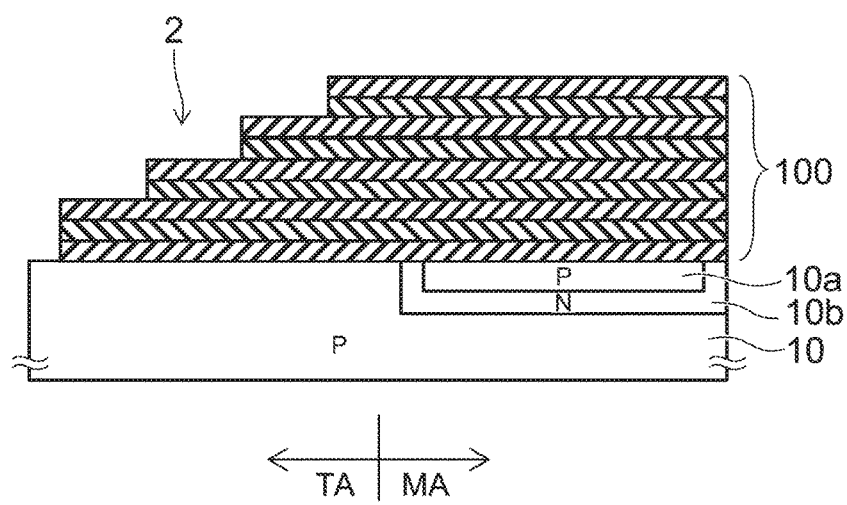

As shown in FIG. 34B, the staircase portion 2 is formed in a portion of the stacked body 100 above the terrace region TA.

Figure 35A:
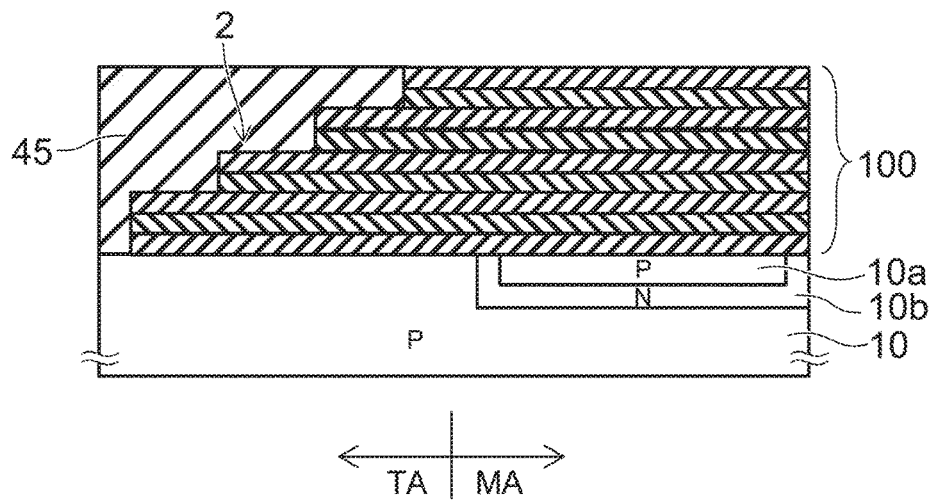

As shown in FIG. 35A, the insulating layer 45 is formed on the staircase portion 2 so as to cover the staircase portion 2.

Figure 35B:
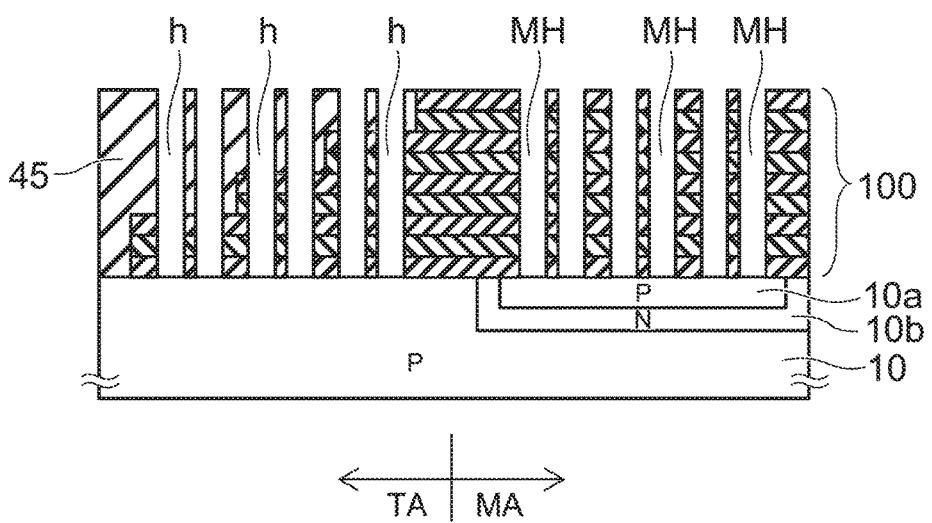

Subsequently, as shown in FIG. 35B, the multiple memory holes MH is formed in the stacked body 100 above the memory region MA and the multiple holes h is formed in the stacked body 100 above the terrace region TA. Subsequently, the first columnar portions CL1 are formed in the memory holes MH and the second columnar portions CL2 are formed in the holes h.

Figure 36A:
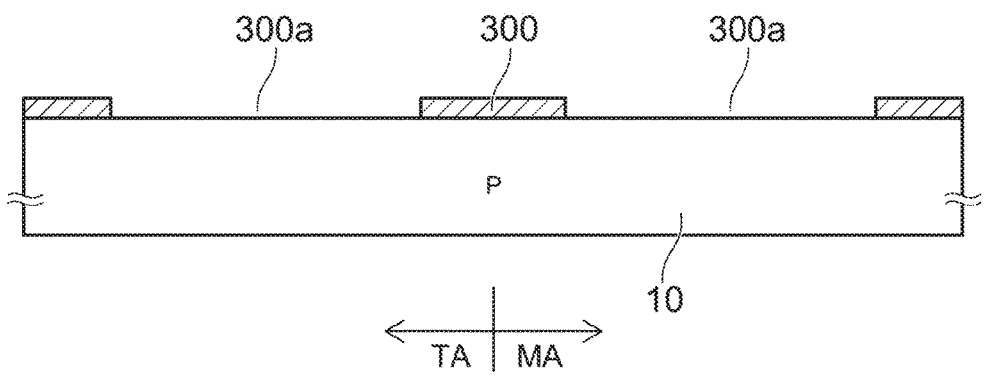
Figure 36B:
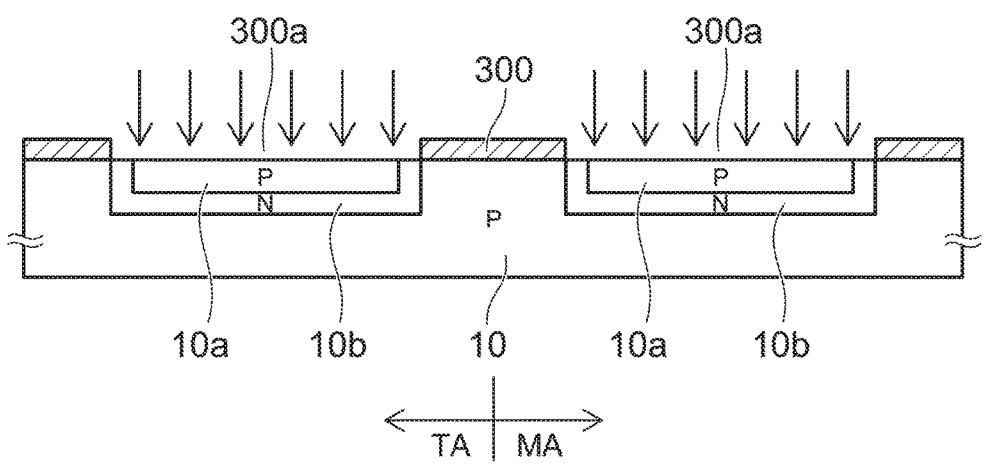

FIG. 36A and FIG. 36B are schematic cross-sectional views showing a method for manufacturing the semiconductor device shown in FIG. 30.

As shown in FIG. 36A, the mask 300 is formed on the surface of the P-type substrate 10. The openings 300a are formed in the mask 300 in the memory region MA and the terrace region TA by lithography.

Impurities are implanted into the surface of the substrate 10 in the memory region MA and the terrace region TA through the openings 300a by ion implantation method. As shown in FIG. 36B, the N-type well 10b and the P-type well 10a are formed in the surface of the substrate 10 in the memory region MA, and the N-type well 10b and the P-type well 10a are formed in the surface of the substrate 10 in the terrace region TA.

Subsequently, the same processes as those in FIGS. 34A to 35B are continued.

Figure 37A:
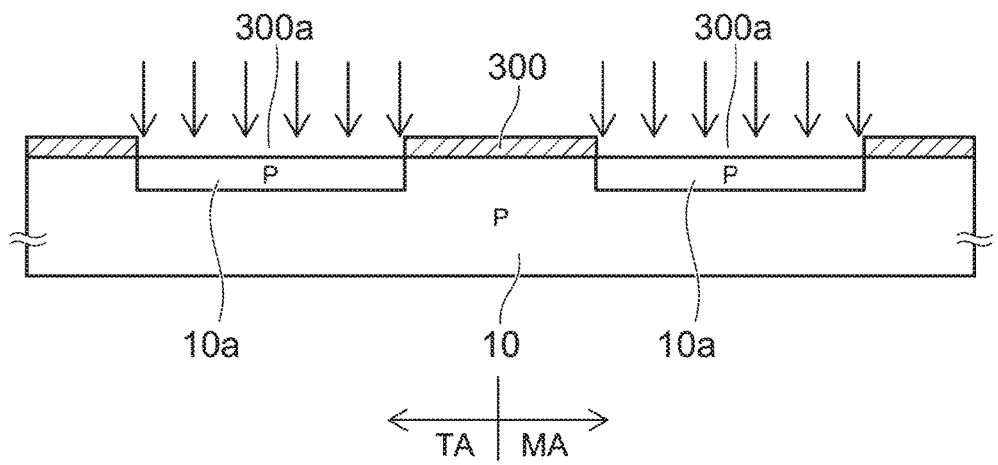
Figure 37B:
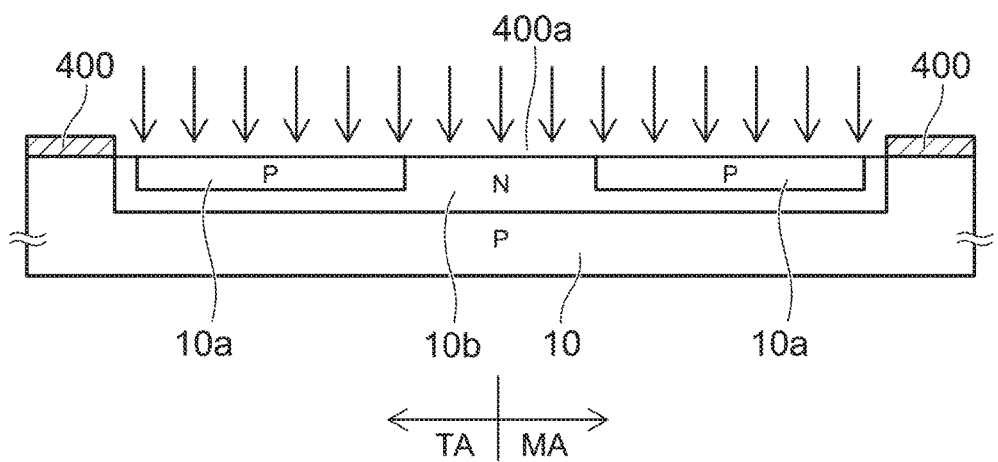

FIG. 37A and FIG. 37B are schematic cross-sectional views showing a method for manufacturing the semiconductor device shown in FIG. 31.

As shown in FIG. 37A, the mask 300 is formed on the surface of the P-type substrate 10. The openings 300a are formed in the mask 300 in the memory region MA and the terrace region TA by lithography.

Impurities are implanted into the surface of the substrate 10 in the memory region MA and the terrace region TA through the openings 300a by ion implantation method. The P-type well 10a is formed in the surface of the substrate 10 in the memory region MA, and the P-type well 10a is formed in the surface of the substrate 10 in the terrace region TA.

Subsequently, as shown in FIG. 37B, a mask 400 is formed on the surface of the substrate 10. An opening 400a is formed in the mask 400 by lithography. The opening 400a is continuous in the memory region MA and the terrace region TA.

Impurities are implanted into the surface of the substrate 10 in the memory region MA and the terrace region TA through the opening 400a by ion implantation method. The N-type well 10b deeper than the P-type well 10a is formed.

Subsequently, the same processes as those in FIGS. 34A to 35B are continued.

Figure 38A:
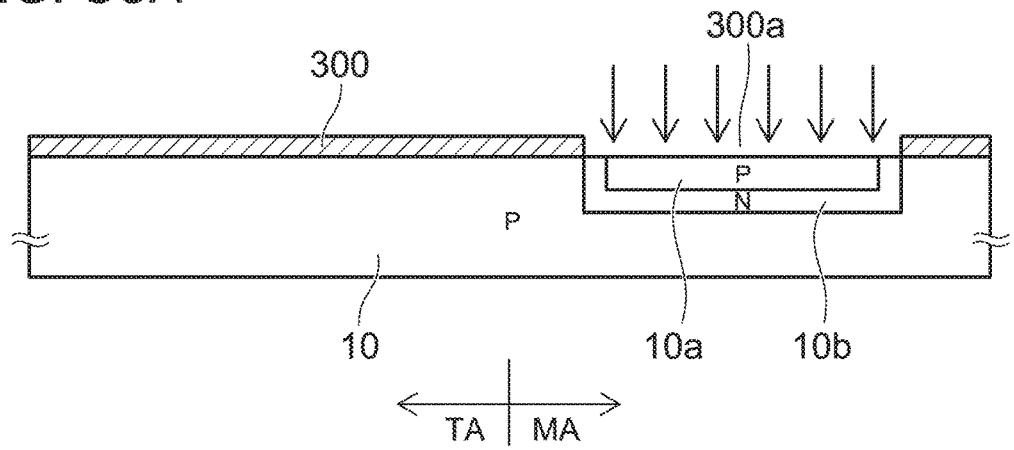
Figure 38B:
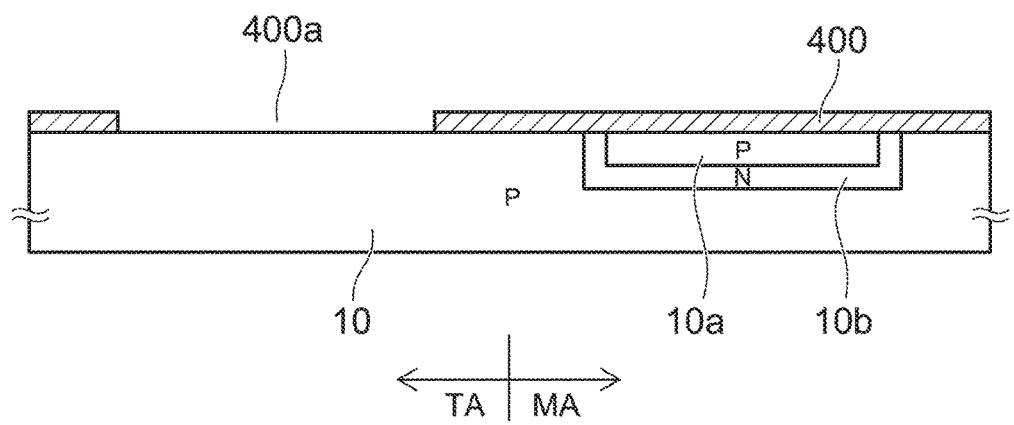
Figure 38C:
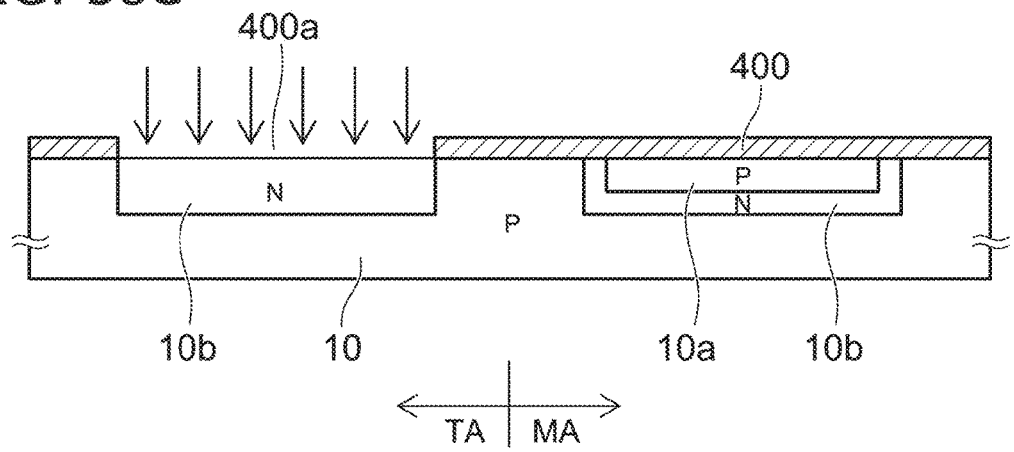

FIG. 38A to FIG. 38C are schematic cross-sectional views showing a method for manufacturing the semiconductor device shown in FIG. 32.

As shown in FIG. 38A, the mask 300 is formed on the surface of the P-type substrate 10. The opening 300a is formed in the mask 300 in the memory region MA by lithography.

Impurities are implanted into the surface of the substrate 10 in the memory region MA through the opening 300a by ion implantation method. The P-type well 10a and the N-type well 10b are formed in the surface of the substrate 10 in the memory region MA.

Subsequently, as shown in FIG. 38B, the mask 400 is formed on the surface of the substrate 10. The opening 400a is formed in the mask 400 in the terrace region TA by lithography.

Impurities are implanted into the surface of the substrate 10 in the terrace region TA through the opening 400a by ion implantation method. As shown in FIG. 38C, the N-type well 10b is formed in the surface of the substrate 10 in the terrace region TA.

Subsequently, the same processes as those in FIGS. 34A to 35B are continued.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a first semiconductor region of a first conductivity type;
a stacked body provided on the first semiconductor region, the stacked body including a plurality of electrode layers stacked with an insulating body interposed, the stacked body including a first stacked portion and a second stacked portion, the plurality of electrode layers of the second stacked portion including a plurality of terrace portions arranged in a staircase configuration with a level difference in a first direction;
a first columnar portion extending through the first stacked portion in a stacking direction of the stacked body and including a first semiconductor body contacting the first semiconductor region;
an insulating layer provided on the plurality of terrace portions;
a plurality of contact portions extending through the insulating layer in the stacking direction and contacting the plurality of terrace portions;
a second columnar portion extending through the insulating layer and through the second stacked portion in the stacking direction, and including a second semiconductor body contacting the first semiconductor region; and
a first insulating portion dividing the first semiconductor region in the first direction, the first insulating portion provided under a boundary portion between the first stacked portion and the second stacked portion.

2. The semiconductor device according to claim 1, further comprising a second semiconductor region of a second conductivity type provided under the first semiconductor region, and contacting the first semiconductor region.

3. The semiconductor device according to claim 2, wherein
a bottom of the first insulating portion reaches the second semiconductor region.

4. The semiconductor device according to claim 2, wherein the first semiconductor region is a P-type semiconductor region, and the second semiconductor region is an N-type semiconductor region.

5. The semiconductor device according to claim 1, wherein the first insulating portion extends in a second direction crossing the first direction.

6. The semiconductor device according to claim 1, further comprising a separation portion extending in the stacking direction and the first direction, and dividing the stacked body in a second direction crossing the first direction.

7. The semiconductor device according to claim 6, wherein the separation portion includes an interconnect portion contacting the first semiconductor region.

8. The semiconductor device according to claim 7, further comprising a second insulating portion provided along the first direction at a side of a lower end portion of the interconnect portion, the second insulating portion separating the first semiconductor region under the interconnect portion from the first semiconductor region under the plurality of terrace portions.

9. The semiconductor device according to claim 8, further comprising a second semiconductor region of a second conductivity type provided under the first semiconductor region, and contacting the first semiconductor region.

10. The semiconductor device according to claim 9, wherein a bottom of the second insulating portion reaches the second semiconductor region.

11. The semiconductor device according to claim 7, wherein
the separation portion includes a first portion dividing the first stacked portion, and a second portion dividing the second stacked portion,
the first portion includes the interconnect portion, and
the second portion does not include the interconnect portion.

12. The semiconductor device according to claim 1, wherein
the first columnar portion includes a first stacked film provided between the first semiconductor body and one of the plurality of electrode layers, and
the second columnar portion includes a second stacked film provided between the second semiconductor body and one of the plurality of electrode layers, and being of a same material as the first stacked film of the first columnar portion.

13. The semiconductor device according to claim 12, wherein the first stacked film and the second stacked film include a charge storage portion.

14. The semiconductor device according to claim 13, wherein the charge storage portion extends to be continuous in the stacking direction.

15. The semiconductor device according to claim 1, further comprising a charge storage portion provided between the first columnar portion and one of the plurality of electrode layers.

* * * * *